(12) United States Patent
Shim et al.

(10) Patent No.: US 8,729,678 B2
(45) Date of Patent: May 20, 2014

(54) IMAGE SENSOR FOR STABILIZING A BLACK LEVEL

(75) Inventors: Eun-Sub Shim, Anyang-si (KR);
Jung-Chak Ahn, Yongin-si (KR);
Moo-Sup Lim, Yongin-si (KR);
Hyung-Jin Bae, Suwon-si (KR);
Min-Seok Oh, Osan-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

(21) Appl. No.: 13/615,451

(22) Filed: Sep. 13, 2012

(65) Prior Publication Data
US 2013/0099341 A1    Apr. 25, 2013

(30) Foreign Application Priority Data

Oct. 21, 2011    (KR) .......................... 10-2011-0107769

(51) Int. Cl.
*H01L 23/552*    (2006.01)
(52) U.S. Cl.
USPC ..... 257/659; 257/294; 257/435; 257/E29.282
(58) Field of Classification Search
None
See application file for complete search history.

(56) References Cited

U.S. PATENT DOCUMENTS

| | | | |
|---|---|---|---|
| 6,806,522 B2 * | 10/2004 | Ohkubo | 257/292 |
| 7,427,740 B2 | 9/2008 | Park et al. | |
| 7,511,324 B2 | 3/2009 | Unagami et al. | |
| 2006/0175535 A1 * | 8/2006 | Park et al. | 250/208.1 |
| 2007/0290245 A1 * | 12/2007 | Unagami et al. | 257/294 |
| 2010/0291730 A1 * | 11/2010 | Uya et al. | 438/73 |
| 2011/0049336 A1 * | 3/2011 | Matsunuma | 250/214.1 |
| 2012/0075478 A1 * | 3/2012 | Ahn | 348/164 |

FOREIGN PATENT DOCUMENTS

| | | |
|---|---|---|
| JP | 2010245499 A | 10/2000 |
| JP | 2007335751 A | 12/2007 |
| JP | 2010245499 A  * | 10/2010 |
| KR | 100654342 B1 | 11/2006 |

OTHER PUBLICATIONS

Machine Translation of Saikai JP 2010245499A Oct. 28, 2010.*

* cited by examiner

*Primary Examiner* — Tan N Tran
*Assistant Examiner* — Scott R Wilson
(74) *Attorney, Agent, or Firm* — Sughrue Mion, PLLC

(57) ABSTRACT

An image sensor includes first pixels, second pixels and a deep trench. The first pixels are formed in an active region of a semiconductor substrate, and configured to measure photo-charges corresponding to incident light. The second pixels are formed in an optical-black region of the semiconductor substrate, and are configured to measure black levels. The deep trench is formed vertically in a boundary region of the optical-black region, where the boundary region is adjacent to the active region, and configured to block leakage light and diffusion carriers from the active region.

13 Claims, 19 Drawing Sheets

IMAGE SENSOR FOR STABILIZING A BLACK LEVEL

CROSS-REFERENCE TO RELATED APPLICATION

This application claims priority from Korean Patent Application No. 10-2011-0107769, filed on Oct. 21, 2011, in the Korean Intellectual Property Office (KIPO), the contents of which are herein incorporated by reference in their entirety.

BACKGROUND

1. Technical Field

Apparatuses and methods consistent with exemplary embodiments relate to photo-sensing devices, and more particularly to an image sensor having light-leakage prevention structure to stabilize black levels.

2. Description of the Related Art

An image sensor converts photo charges corresponding to a captured image into electric signals, and is widely used in digital cameras, game devices, vision systems, and the like.

The image sensor may be a charge coupled device (CCD) and a complementary metal-oxide semiconductor (CMOS) device.

In general, the image sensor includes additional pixels for providing black levels or dark levels corresponding to reference levels irrelevant to the incident light. For example, the black level may depend on the operational temperature of the image sensor. Particularly when the incident light has high intensity, a portion of the incident light may arrive at the additional pixels through reflection, refraction and diffraction to affect the black levels. Also, photo carriers generated by the incident light may be diffused to the additional pixels to affect the black levels. Such phenomenon that is referred to as light-leakage phenomenon may distort the black levels and thus a quality of displayed images may be degraded.

SUMMARY

Exemplary embodiments may address at least the above problems and/or disadvantages and other disadvantages not described above. Also, exemplary embodiments are not required to overcome the disadvantages described above, and an exemplary embodiment may not overcome any of the problems described above.

One or more exemplary embodiments provide image sensors having light-leakage prevention vertical structure and/or light-leakage prevention horizontal structure for stabilizing the black level.

According to an aspect of an exemplary embodiment, an image sensor includes first pixels, second pixels and a deep trench. The first pixels are formed in an active region of a semiconductor substrate, and the first pixels are configured to measure photo-charges corresponding to incident light. The second pixels are formed in an optical-black region of the semiconductor substrate, and the second pixels are configured to measure black levels. The deep trench is formed vertically in a boundary region of the optical-black region where the boundary region is adjacent to the active region, and the deep trench is configured to block leakage light and diffusion carriers from the active region.

A depth of the deep trench may be greater than depths of photoelectric conversion units of the first and second pixels.

The deep trench may be filled with dielectric material having a refractive index higher than a refractive index of the semiconductor substrate. A metal coating layer may be formed on an inner surface of the deep trench.

The optical-black region may include a first optical-black region and a second optical-black region disposed at both sides of the active region, respectively, and the deep trench may include a first deep trench and a second deep trench such that the first deep trench is formed vertically in the boundary region of the first optical-black region and the second deep trench is formed vertically in the boundary region of the second optical-black region.

The optical-black region may surround the active region, and the deep trench may have a ring-shape to surround the active region.

The image sensor may further include a buried well formed horizontally in a bottom portion of the optical-black region, and the buried well may be configured to block the diffusion carriers from the active region.

The semiconductor substrate may be doped with p-type impurities and the buried well may be doped with p-type impurities with higher doping density than the semiconductor substrates to repel photoelectrons from the active region.

The image sensor may further include a buried well and a vertical contact. The buried well may be formed horizontally in a bottom portion of the optical-black region, and the buried well may be doped with n-type impurities to capture photoelectrons diffused from the active region. The vertical contact may be formed vertically from an upper surface of the semiconductor substrate to the buried well, and the vertical contact may be configured to apply a positive drain voltage to the buried well.

The vertical contact may be disposed at an end portion of the optical-black region, where the end portion is opposite to the boundary region.

The image sensor may further include a first buried well, a second buried well and a vertical contact. The first buried well may be formed horizontally in a bottom portion of the optical-black region, and the first buried well may be doped with p-type impurities to repel the photoelectrons diffused from the active region. The second buried well may be formed horizontally in another bottom portion of the optical-black region, and the second buried well may be doped with n-type impurities to capture photoelectrons diffused from the active region. The vertical contact may be formed vertically from an upper surface of the semiconductor substrate to the second buried well, and the vertical contact may be configured to apply a positive drain voltage to the second buried well.

The first buried well may be disposed on the second buried well or the second buried well may be disposed on the first buried well.

According to an aspect of an exemplary embodiment, an image sensor includes first pixels, second pixels, an n-type buried well and a vertical contact. The first pixels are formed in an active region of a semiconductor substrate, and the first pixels are configured to measure photo-charges corresponding to incident light. The second pixels are formed in an optical-black region of the semiconductor substrate, and the second pixels are configured to measure black levels. The n-type buried well is formed horizontally in a bottom portion of the optical-black region, and the n-type buried well is doped with n-type impurities to capture photoelectrons diffused from the active region. The vertical contact is formed vertically from an upper surface of the semiconductor substrate to the n-type buried well, and the vertical contact is configured to apply a positive drain voltage to the n-type buried well.

The vertical contact may be disposed at an end portion of the optical-black region, where the end portion is opposite to a boundary region adjacent to the active region.

The optical-black region may surround the active region, and the vertical contact may have a ring-shape to surround the optical-black region.

The image sensor may further include a p-type buried well formed horizontally in another bottom portion of the optical-black region, and the p-type buried well may be doped with p-type impurities to repel the photoelectrons diffused from the active region.

BRIEF DESCRIPTION OF THE DRAWINGS

The above and/or other aspects will become apparent by describing certain exemplary embodiments, with reference to the accompanying drawings, in which.

DETAILED DESCRIPTION OF EXEMPLARY EMBODIMENTS

Figure 1:
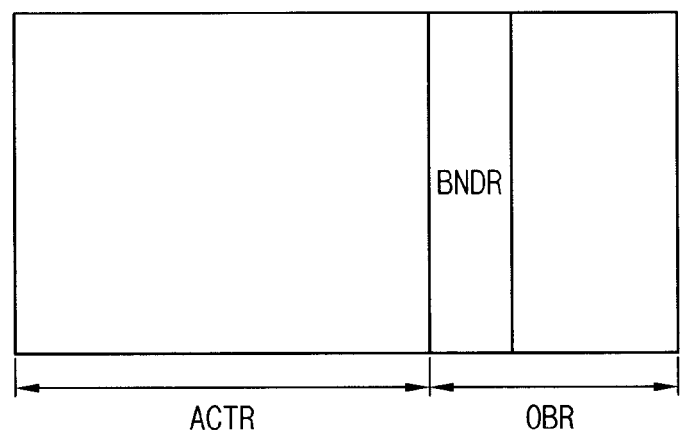
FIG. 1 is a diagram illustrating a layout of an image sensor according to an exemplary embodiment.

Certain exemplary embodiments are described in greater detail below with reference to the accompanying drawings. The present inventive concept may, however, be embodied in many different forms and should not be construed as limited to the exemplary embodiments set forth herein.

In the following description, like drawing reference numerals are used for the like elements, even in different drawings. The matters defined in the description, such as detailed construction and elements, are provided to assist in a comprehensive understanding of exemplary embodiments. However, exemplary embodiments can be carried out without those specifically defined matters. Also, well-known functions or constructions are not described in detail since that would obscure the invention with unnecessary detail. In the drawings, the sizes and relative sizes of layers and regions may be exaggerated for clarity.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular exemplary embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a layout of an image sensor according to an exemplary embodiment.

Referring to FIG. 1, an image sensor 10 includes an active region ACTR and an optical-black region OBR. The optical-black region OBR includes a boundary region BNDR adjacent to the active region ACTR. As will be described with reference to FIGS. 4 through 12, the image sensor 10 may be formed using a semiconductor substrate.

First pixels, that is, active pixels are formed in the active region ACTR of the semiconductor substrate to measure photo-charges corresponding to incident light. Second pixels, that is, auto dark level compensation (ADLC) pixels are formed in the optical-black region OBR of the semiconductor substrate.

A light-leakage prevention vertical structure may be formed in the boundary region BNDR of the optical-black region OBR to block leakage light and diffusion carriers from the active region ACTR. The diffusion carriers may be electrons or holes. In some exemplary embodiments, the light-leakage prevention vertical structure may include a deep trench as will be described with reference to FIGS. 4 through 9. In other exemplary embodiments, the light-leakage prevention vertical structure may include a structure such that a drain voltage is applied to photoelectric conversion units of dummy pixels as will be described with reference to FIGS. 10, 11 and 12.

A light-leakage prevention horizontal structure may be formed in the optical-black region OBR. The light-leakage prevention horizontal structure may include a light shielding film 230 configured to directly block the incident light as illustrated in FIGS. 4 through 12. In some exemplary embodiments, the light-leakage prevention horizontal structure may include at least one buried well configured to repel or capture the diffusion carriers from the active region ACTR as will be described with reference to FIGS. 6 through 12.

Using the light-leakage prevention vertical structure and/or the light-leakage prevention horizontal structure, the leakage light and/or the diffusion carriers from the active region ACTR may be prevented from arriving at the second pixels and thus the black levels measured by the second pixels may be stabilized.

The example embodiments may be applied to various image sensors. For example, the image sensor 10 may include an automotive sensor, an organic sensor, a charge coupled device (CCD) image sensor, a complementary metal-oxide semiconductor (CMOS) image sensor, a three-dimensional image sensor, a global-shuttered image sensor, a rolling-shuttered image sensor, etc.

The operations of the image sensor 10 are described with reference to FIGS. 2 and 3, and then the light-leakage prevention structures of the image sensor 10 according to exemplary embodiments are described with references to FIGS. 4 through 12.

Figure 2:
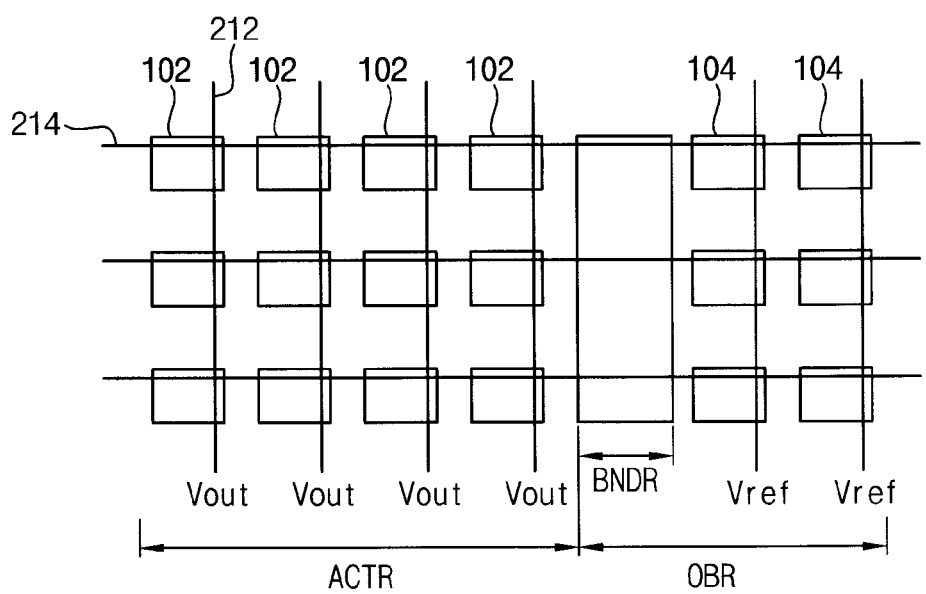
FIG. 2 illustrates an example arrangement of pixels of an image sensor according to an exemplary embodiment.

FIG. 2 illustrates an example arrangement of pixels for describing an operation of an image sensor according to an exemplary embodiment.

Referring to FIG. 2, the first pixels 102 to receive and measure the incident light are formed in the active region ACTR of the semiconductor substrate, and the second pixels 104 to measure the black levels are formed in the optical-black region OBR of the semiconductor substrate except the boundary region BNDR. First wires 214 may be arranged above the semiconductor substrate in row direction and second wires 212 may be arranged above the semiconductor substrate in column direction. The first wires 214 may be extended in row direction through the active region ACTR and the optical-black region OBR so that the first wires 214 may be commonly connected to the first pixels 102 in the active region ACTR and the second pixels 104 in the optical-black region OBR. Electrical image signals Vout provided by the first pixels 102 and reference signals Vref provided by the second pixels 104 may be transferred to an internal logic circuit (not shown) through the second wires 212. A plurality of the second pixels 104 may be included per row, and an average level of the reference signals Vref may be provided as a black level so that the averaged black level may be subtracted from the image signals Vout with respect to the pixels 102 and 104 in the same TOW.

Figure 3:
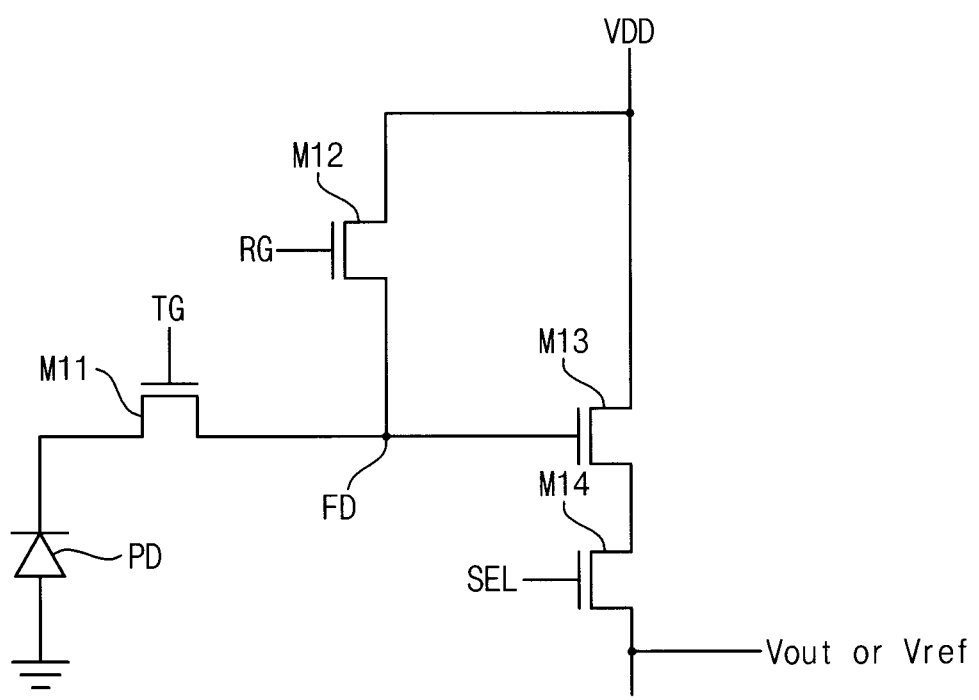
FIG. 3 is a circuit diagram illustrating an example of a pixel structure of the image sensor.

FIG. 3 is a circuit diagram illustrating an example of a pixel structure of the image sensor of FIG. 2.

Referring to FIG. 3, each of the pixels 102 and 104 of the image sensor 10 may include a photoelectric conversion unit such as a photodiode PD, a transfer transistor M11, a reset transistor M12, a source follower transistor M13 and a selection transistor M14. Although FIG. 3 illustrates four-transistor structure, the present general inventive concept is not limited thereto. The image sensor may have a three-transistor structure, a five-transistor structure or a structure where a plurality of pixels share one or more transistors.

Hereinafter, an operation of the image sensor 10 is described with reference to FIGS. 2 and 3.

When the reset transistor M12 is turned on by raising a voltage level of a gate RG of the reset transistor M12, a voltage level of a floating diffusion node FD, which is a sensing node, increases up to a power supply voltage VDD.

When an external light is incident onto the photodiode PD during a photo integration period, electron-hole pairs are generated in proportion to the amount of the incident light.

After the photo integration period, when a voltage level of a gate TG of the transfer transistor M11 increases, electrons integrated within the photodiode PD are transferred to the floating diffusion node FD through the transfer transistor M11. The electric potential of the floating diffusion node FD drops in proportion to the amount of the transferred electrons, and then the electric potential of the source in the source follower transistor M13 is varied depending on the amount of the transferred electrons of the floating diffusion node FD.

When the selection transistor M14 is turned on by raising a voltage level of a gate SEL of the selection transistor M14, the electric potential of the floating diffusion node FD is transferred, as an output signal, through the source follower transistor M13. As such, the first pixels 102 convert the incident light to electric signals by performing the photoelectric conversion and output the image signals Vout. The second pixels 104 shielded from the incident light output the reference signals Vref for the black level compensation. The first pixels 102 and the second pixels 104 may have the same structures and may be formed through the same manufacturing processes to have the same characteristics.

The outputs Vout and Vref of the pixels 102 and 104 may be transferred through the second wires 212, and the voltages of the gates TG, RG and SEL in the transistors M11, M12 and M14 may be transferred through the first wires 214.

FIGS. 4 through 12 are cross-sectional views illustrating image sensors according to exemplary embodiments, and the repeated description may be omitted with respect to FIGS. 4 through 12.

Figure 4:
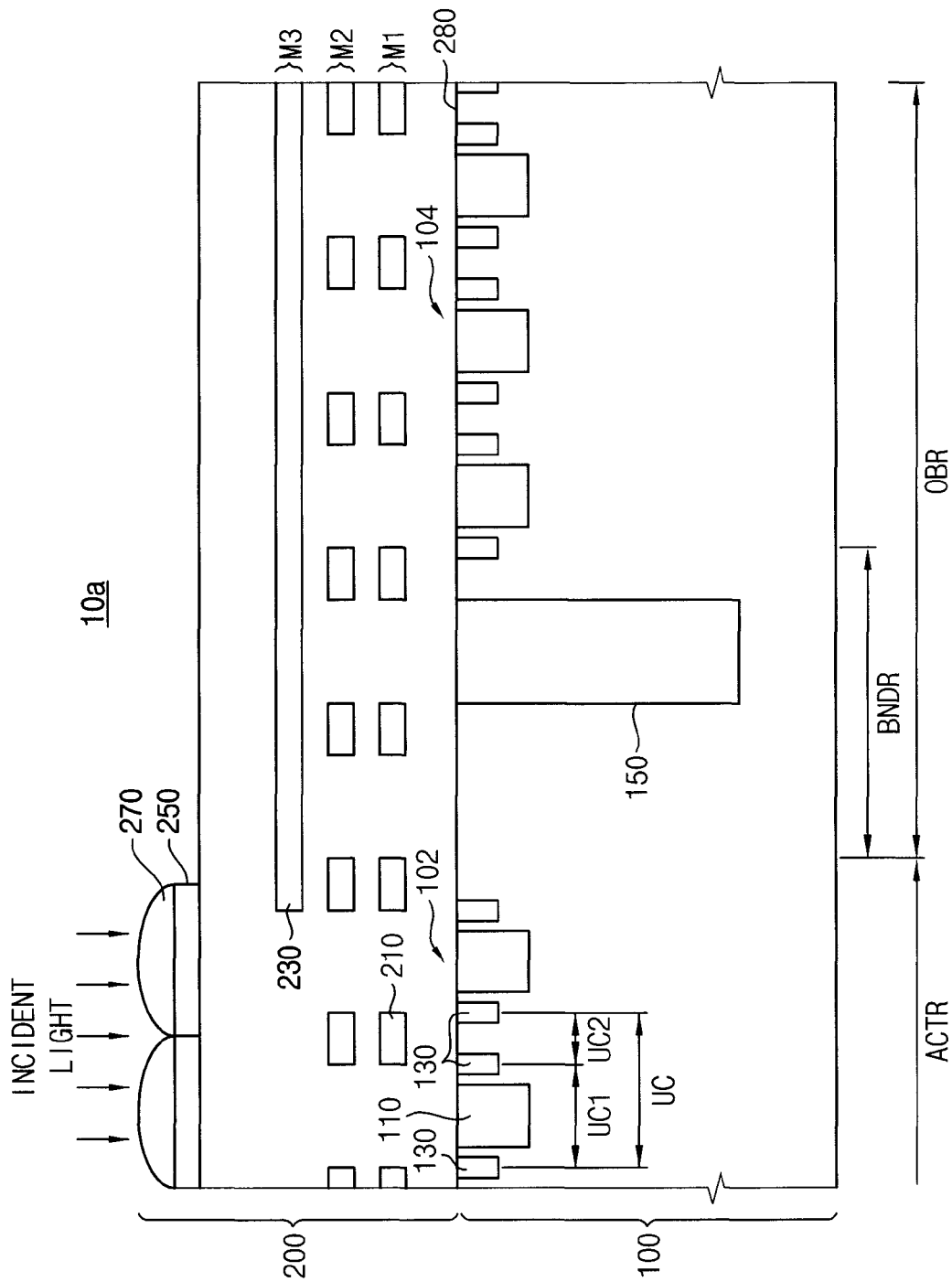
FIGS. 4, 5, 6, 7, 8, 9, 10, 11 and 12 are cross-sectional views illustrating image sensors according to an exemplary embodiment.

Referring to FIG. 4, an image sensor 10a may include first pixels 102, second pixels 104 and a deep trench 150.

The first pixels 102, that is, the active pixels are formed in the active region ACTR of the semiconductor substrate 100 to measure photo-charges corresponding to incident light. The second pixels 104, that is, the auto dark level compensation (ADLC) pixels are formed in the optical-black region OBR of the semiconductor substrate 100 to provide the black levels. The first pixels 102 and the second pixels 104 may have the same structures and may be formed through the same manufacturing processes to have the same characteristics. Each pixel 102 or 104 may be formed per unit region UC that includes a first unit region UC1 and a second unit region UC2. A photoelectric conversion unit 110 such as a photodiode is formed in the first unit region UC1 and a floating diffusion node FD, a transfer transistor M11, etc. as described with reference to FIG. 3 are formed in the second unit region UC2. Shallow trenches 130 may be formed at the boundaries of the unit regions UC and at the boundaries of the first unit region UC1 and the second unit region UC2 using shallow trench isolation (STI) processes.

The deep trench 150 is formed substantially vertically, with respect to an upper surface 280 of the semiconductor substrate 100, in the boundary region BNDR of the optical-black region OBR where the boundary region BNDR is adjacent to the active region ACTR. The deep trench 150 is configured to block leakage light and diffusion carriers from the active region ACTR.

A depth of the deep trench 150 is greater than depths of photoelectric conversion units 110 of the first and second pixels 102 and 104 so that the leakage light and the diffusion carriers may be sufficiently prevented from being transferred to the optical-black region OBR from the active region ACTR. At least a portion of manufacturing processes of the deep trench 150 may be performed simultaneously with the STI processes, and thus the deep trench 150 may be formed efficiently by modifying the STI processes without causing excessive additional processes.

The deep trench 150 may be filled with dielectric material having a refractive index higher than a refractive index of the semiconductor substrate 100. In this case, the leakage light from the active region ACTR may be reflected totally at the sidewall surface of the deep trench 150 and thus the second pixels 104 in the optical-black region OBR may be shielded from the leakage light.

A plurality of metal layers M1, M2 and M3, color filters 250, micro lenses 270, etc. may be formed in the upside space 200 over the semiconductor substrate 100. In the uppermost metal layer M3, a light shielding film 230 configured to directly block the incident light may be formed to cover the entire optical-black region OBR including the boundary region BNDR. In the lower metal layers M2 and M1, metal wires or traces 210 may be patterned for transferring signals and power supply voltages.

As such, the image sensor 10a of FIG. 4 may provide stabilized black levels using the light-leakage prevention vertical structure such as the deep trench 150.

Figure 5:
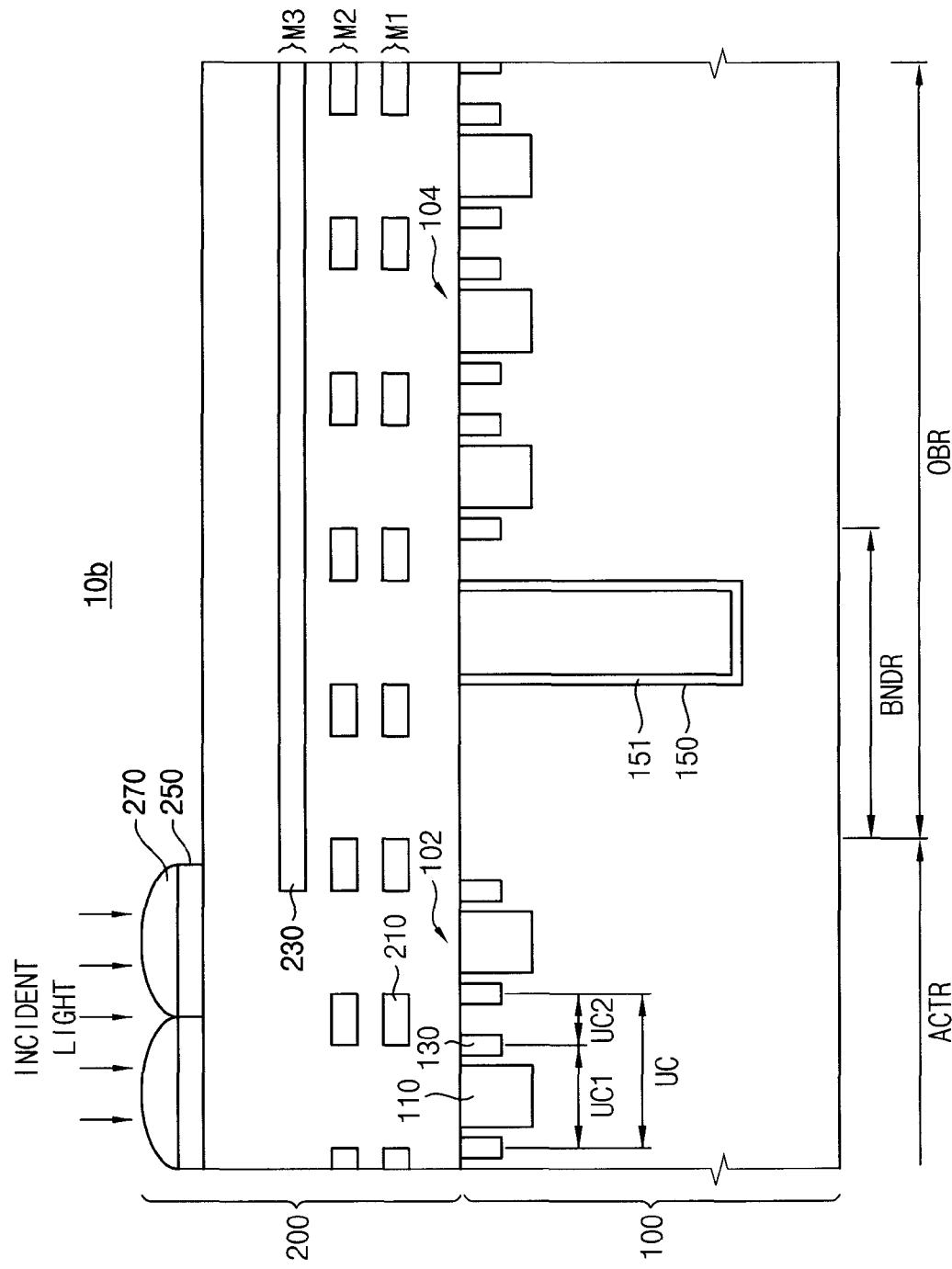

Referring to FIG. 5, an image sensor 10b may include first pixels 102, second pixels 104 and a deep trench 150.

The first pixels 102 are formed in the active region ACTR of the semiconductor substrate 100 to measure photo-charges corresponding to incident light. The second pixels 104 are formed in the optical-black region OBR of the semiconductor substrate 100 to provide the black levels. The deep trench 150 is formed vertically in the boundary region BNDR adjacent to the active region ACTR of the optical-black region OBR to block the leakage light and the diffusion carriers from the active region ACTR.

As compared with the embodiment of FIG. 4, a metal coating layer 151 may be further formed on an inner surface of the deep trench 150. In this case, a critical angle of total reflection at the surface of the deep trench 150 in FIG. 5 may be further decreased, and thus the second pixels 104 in the optical-black region OBR may be further shielded from the leakage light. In addition, the diffusion carriers, for example, diffusion electrons may be captured by the metal coating layer 151 and thus the second pixels 104 in the optical-black region OBR may be further shielded from the diffusion carriers.

Figure 6:
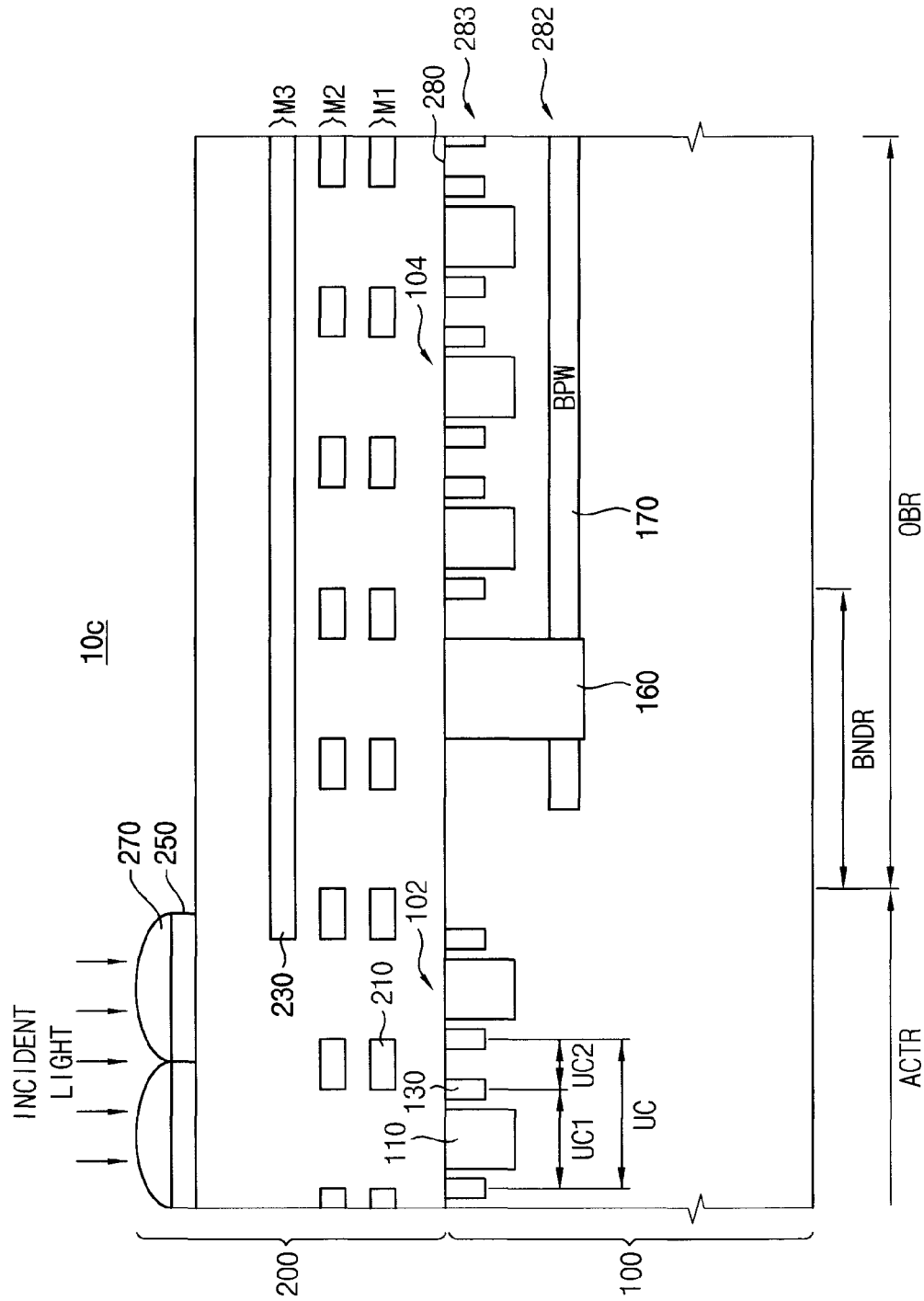

Referring to FIG. 6, an image sensor 10c may include first pixels 102, second pixels 104, a deep trench 160 and a first buried well (BPW) 170.

The first pixels 102 are formed in the active region ACTR of the semiconductor substrate 100 to measure photo-charges corresponding to incident light. The second pixels 104 are formed in the optical-black region OBR of the semiconductor substrate 100 to provide the black levels. The deep trench 160 is formed vertically in the boundary region BNDR adjacent to the active region ACTR of the optical-black region OBR to block the leakage light and the diffusion carriers from the active region ACTR.

As compared with the embodiment of FIG. 4, the image sensor 10c of FIG. 6 further includes the first buried well 170. The first buried well 170 is formed substantially horizontally, with respect to the upper surface 280 of the semiconductor substrate 100, in a bottom portion 282 of the optical-black region OBR and the first buried well 170 is configured to block the diffusion carriers, that is, diffusion electrons from the active region ACTR from moving into an upper region 283 of the optical-black region OBR. For example, the semiconductor substrate 100 may be doped with p-type impurities and the first buried well 170 may be doped with p-type impurities with higher doping density than the semiconductor substrates 100 to repel photoelectrons from the active region ACTR. In this case, the second pixels 104 in the optical-black region OBR may be further shielded from the diffusion carriers inflowing through the bottom portion 282 of the optical-black region OBR, thereby providing the further stabilized black levels.

The deep trench 160 may be formed to the depth of contacting or penetrating the first buried well 170 so that the deep trench 160 and the first buried well 170 may form the closed shielding structure. The depth of the deep trench 160 of FIG. 6 may be smaller than the depth of the deep trench 150 of FIG. 4 and thus the processes of forming the deep trench may become easier.

As such, the image sensor 10c of FIG. 6 may provide the further stabilized black levels using the combination of the light-leakage prevention vertical structure such as the deep trench 160 and the light-leakage prevention horizontal structure such as the first buried well 170.

Figure 7:
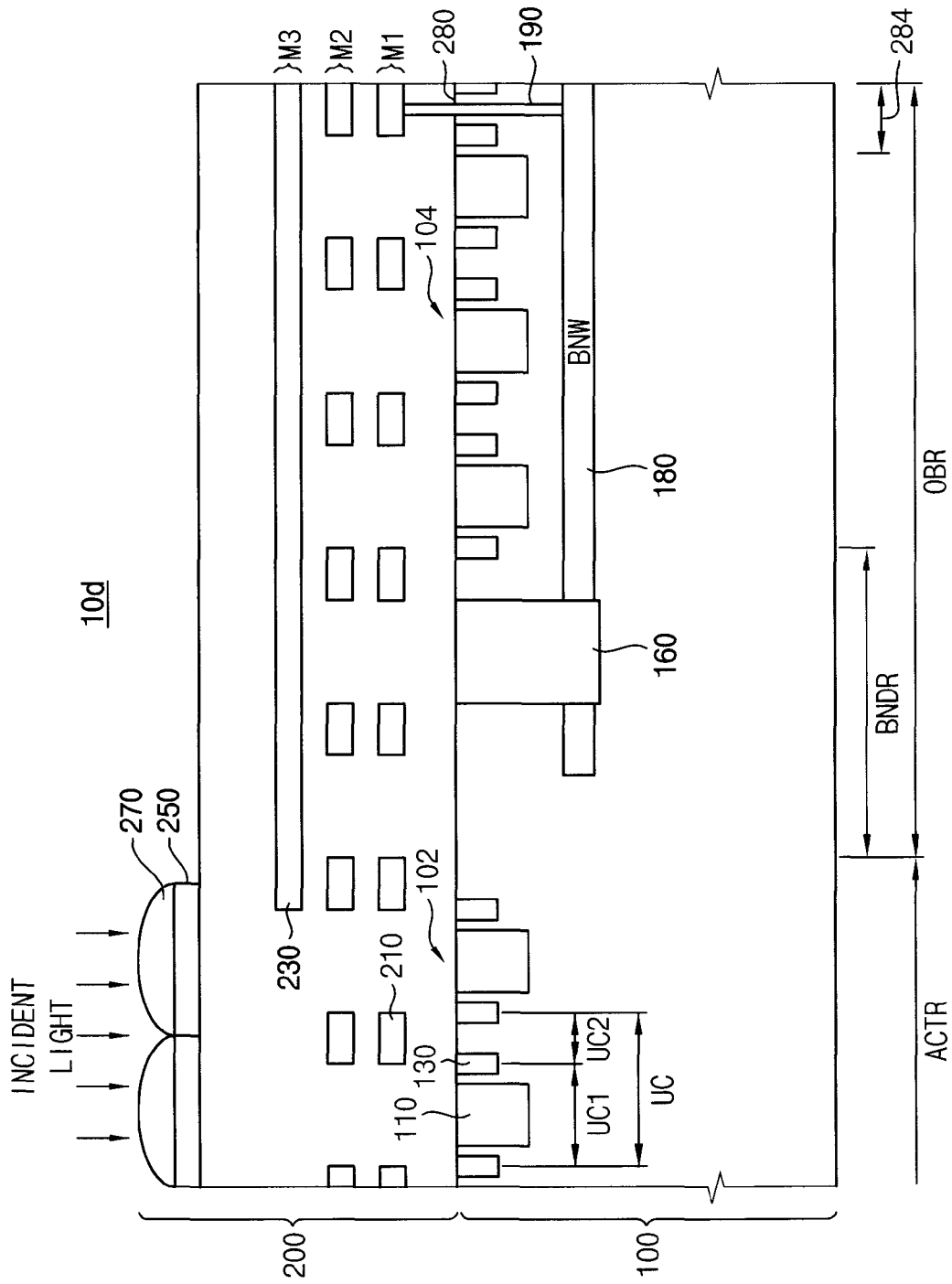

Referring to FIG. 7, an image sensor 10d may include first pixels 102, second pixels 104, a deep trench 160, a second buried well (BNW) 180 and a vertical contact 190.

The first pixels 102 are formed in the active region ACTR of the semiconductor substrate 100 to measure photo-charges corresponding to incident light. The second pixels 104 are formed in the optical-black region OBR of the semiconductor substrate 100 to provide the black levels. The deep trench 160 is formed vertically in the boundary region BNDR adjacent to the active region ACTR of the optical-black region OBR to block the leakage light and the diffusion carriers from the active region ACTR.

As compared with the embodiment of FIG. 4, the image sensor 10d of FIG. 7 further includes the second buried well 180 and the vertical contact 190. The second buried well 180 is formed substantially horizontally, with respect to the upper surface 280, in a bottom portion 282 of the optical-black region OBR and the second buried well 180 is doped with n-type impurities to capture the diffusion carriers from the active region ACTR. The vertical contact 190 is formed in an end portion 284 of the optical-black region OBR, vertically from an upper surface 280 of the semiconductor substrate 100 to the second buried well 180 to apply a positive drain voltage to the second buried well 180. The vertical contact 190 is electrically connected to the metal wire in the metal layer M1 or M2, to which the positive drain voltage is applied, and thus the diffusion electrons captured by the second buried well 180 may be drained through the vertical contact 190. The black levels provided by the second pixels 104 may be further stabilized by capturing and draining the diffusion electrons inflowing from the bottom direction of the optical-black region OBR.

As such, the image sensor 10d of FIG. 7 may provide the further stabilized black levels using the combination of the light-leakage prevention vertical structure such as the deep trench 160 and the light-leakage prevention horizontal structure such as the second buried well 180.

Figure 8:
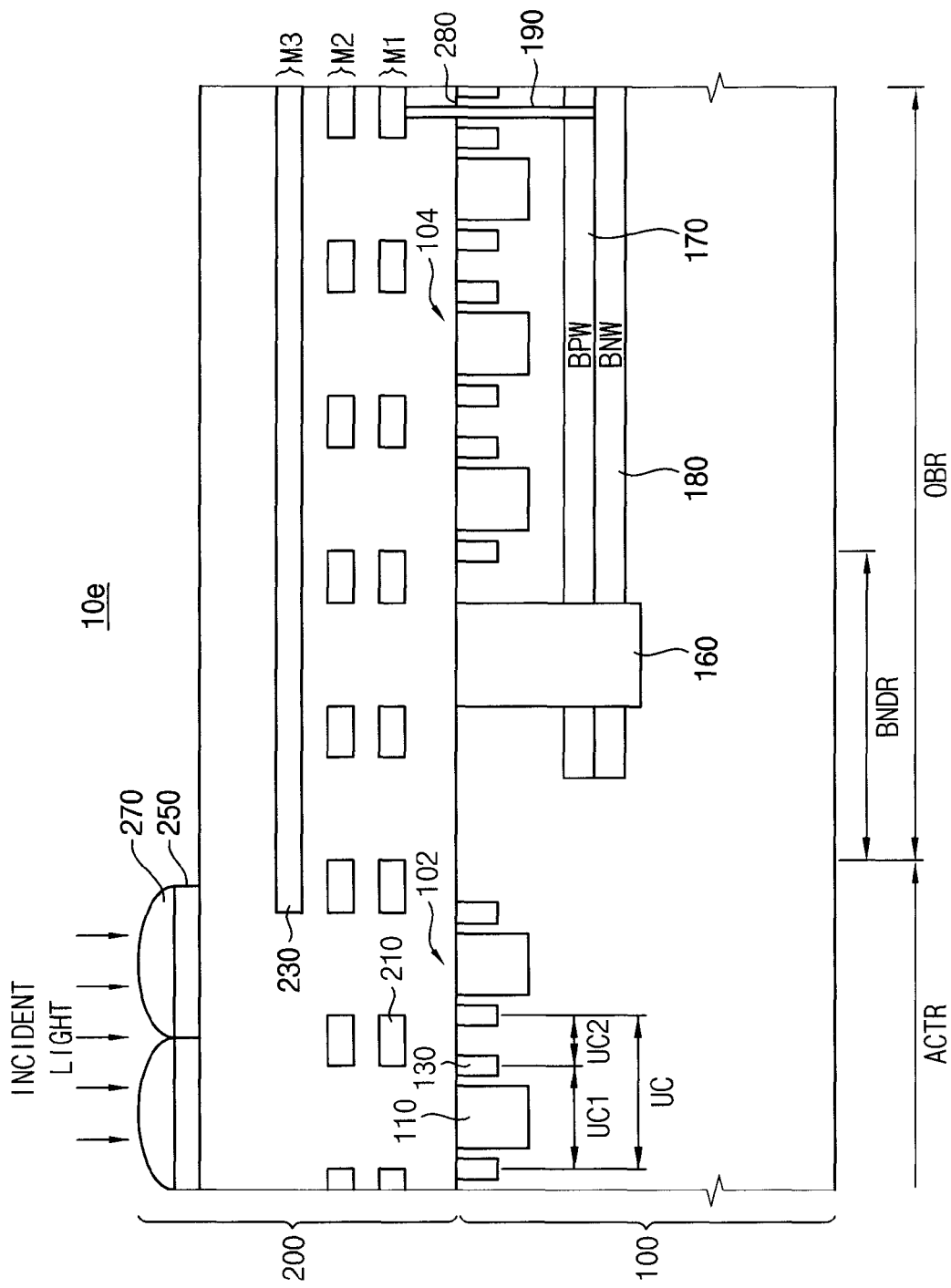

Referring to FIG. 8, an image sensor 10e may include first pixels 102, second pixels 104, a deep trench 160, a first buried well (BPW) 170, a second buried well (BNW) 180 and a vertical contact 190.

The first pixels 102 are formed in the active region ACTR of the semiconductor substrate 100 to measure photo-charges corresponding to incident light. The second pixels 104 are formed in the optical-black region OBR of the semiconductor substrate 100 to provide the black levels. The deep trench 160 is formed vertically in the boundary region BNDR adjacent to the active region ACTR of the optical-black region OBR to block the leakage light and the diffusion carriers from the active region ACTR.

As compared with the embodiment of FIG. 4, the image sensor 10e of FIG. 8 further includes the first buried well 170, the second buried well 180 and the vertical contact 190. The first buried well 170 is formed horizontally in a bottom portion of the optical-black region OBR and the first buried well 170 is doped with p-type impurities to repel the diffusion electrons from the active region ACTR. The second buried well 180 is formed horizontally in another bottom portion of the optical-black region OBR and the second buried well 180 is doped with n-type impurities to capture the diffusion carriers from the active region ACTR.

As illustrated in FIG. 8, the first buried well 170 may be disposed on the second buried well 180, in a direction of the upper surface 280. The vertical contact 190 is formed vertically from an upper surface 280 of the semiconductor substrate 100 to the second buried well 180 to apply a positive drain voltage to the second buried well 180. The vertical contact 190 is electrically connected to the metal wire in the metal layer M1 or M2, to which the positive drain voltage is applied, and thus the diffusion electrons captured by the second buried well 180 may be drained through the vertical contact 190. In addition, the first buried well 170 may repel the electrons escaping from the second buried well 180 and thus the electrons reaching the second pixels 104 may be further reduced. The black levels provided by the second pixels 104 may be further stabilized by capturing and repelling the diffusion electrons using the two buried wells 170 and 180 to reduce the number of electrons reaching the second pixels 104 from the bottom direction of the optical-black region OBR.

As such, the image sensor 10e of FIG. 8 may provide the further stabilized black levels using the combination of the light-leakage prevention vertical structure such as the deep trench 160 and the light-leakage prevention horizontal structure such as the first and second buried wells 170 and 180.

Figure 9:
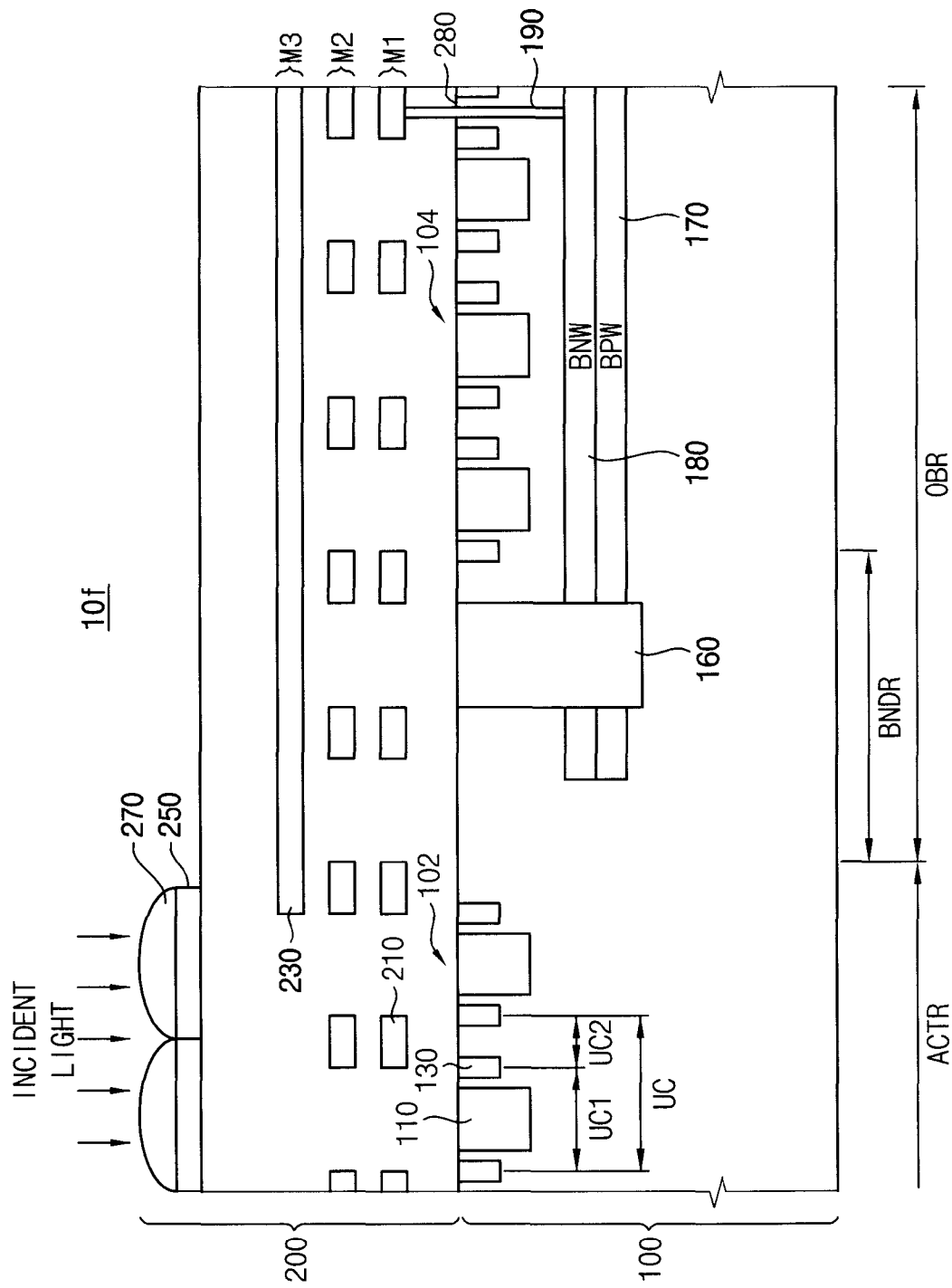

Referring to FIG. 9, an image sensor 10f may include first pixels 102, second pixels 104, a deep trench 160, a first buried well (BPW) 170, a second buried well (BNW) 180 and a vertical contact 190.

The first pixels 102 are formed in the active region ACTR of the semiconductor substrate 100 to measure photo-charges corresponding to incident light. The second pixels 104 are formed in the optical-black region OBR of the semiconductor substrate 100 to provide the black levels. The deep trench 160 is formed vertically in the boundary region BNDR adjacent to the active region ACTR of the optical-black region OBR to block the leakage light and the diffusion carriers from the active region ACTR.

As compared with the embodiment of FIG. 4, the image sensor 10f of FIG. 9 further includes the first buried well 170, the second buried well 180 and the vertical contact 190. The first buried well 170 is formed horizontally in a bottom portion of the optical-black region OBR and the first buried well 170 is doped with p-type impurities to repel the diffusion electrons from the active region ACTR. The second buried well 180 is formed horizontally in another bottom portion of the optical-black region OBR and the second buried well 180 is doped with n-type impurities to capture the diffusion carriers from the active region ACTR.

As compared with the embodiment of FIG. 9, the second buried well 180 may be disposed on the first buried well 170. The vertical contact 190 is formed vertically from an upper surface 280 of the semiconductor substrate 100 to the second buried well 180 to apply a positive drain voltage to the second buried well 180. Even though the first buried well 170 repel the diffusion electrons from the active region ACTR, the electrons having very high energy may penetrate the first buried well 170. The second buried well 180 may capture the electrons penetrating the first buried well 170. The vertical contact 190 is electrically connected to the metal wire in the metal layer M1 or M2, to which the positive drain voltage is applied, and thus the diffusion electrons captured by the second buried well 180 may be drained through the vertical contact 190. The black levels provided by the second pixels 104 may be further stabilized by capturing and repelling the diffusion electrons using the two buried wells 170 and 180 to reduce the number of electrons reaching the second pixels 104 from the bottom direction of the optical-black region OBR.

As such, the image sensor 10f of FIG. 9 may provide the further stabilized black levels using the combination of the light-leakage prevention vertical structure such as the deep trench 160 and the light-leakage prevention horizontal structure such as the first and second buried wells 170 and 180.

Figure 10:
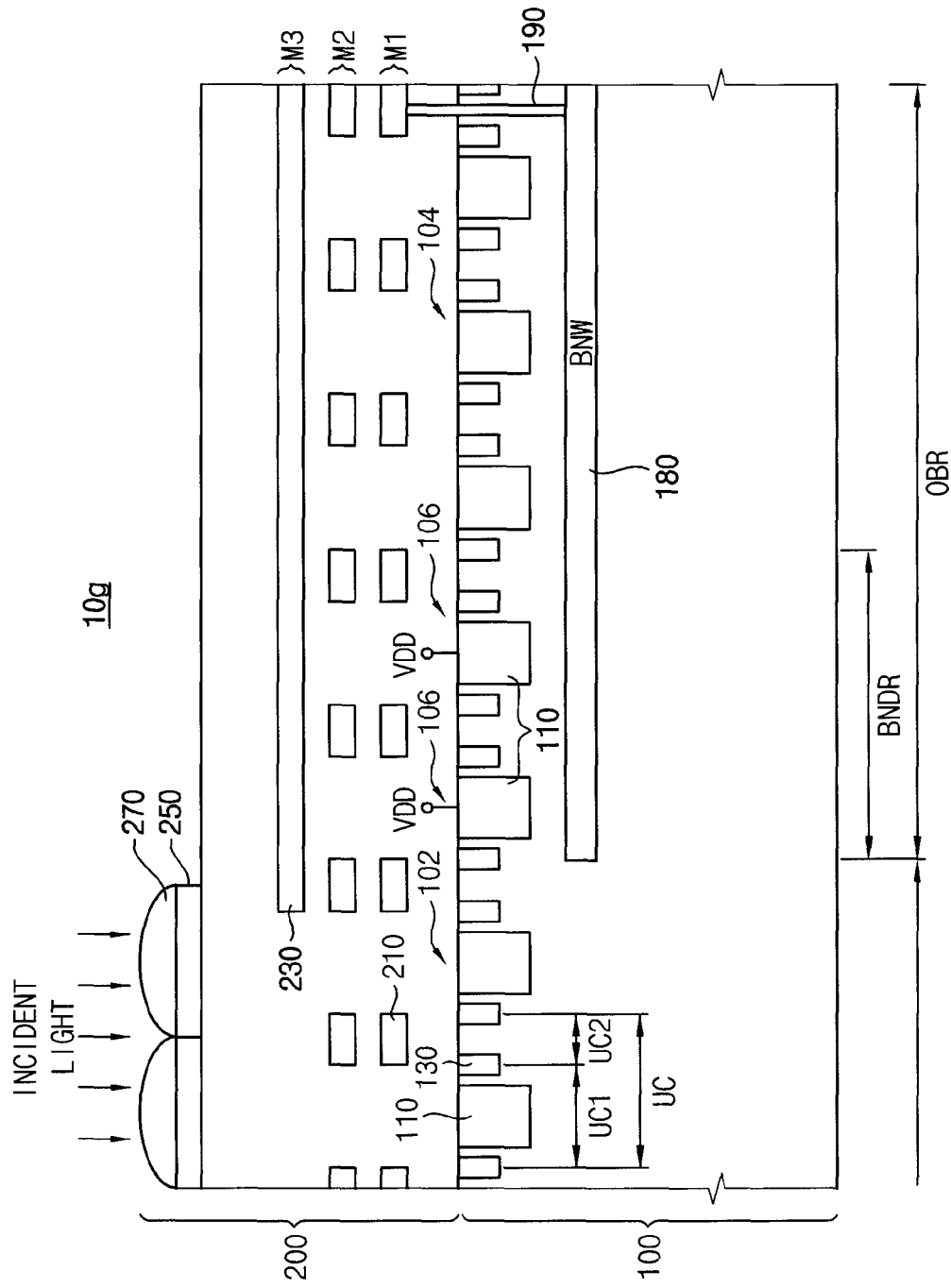

Referring to FIG. 10, an image sensor 10g may include first pixels 102, second pixels 104, a second buried well (BNW) 180 of an n-type and a vertical contact 190.

The first pixels 102 are formed in the active region ACTR of the semiconductor substrate 100 to measure photo-charges corresponding to incident light. The second pixels 104 are formed in the optical-black region OBR of the semiconductor substrate 100 to provide the black levels. In other exemplary embodiments as described above, the deep trench 160 may be formed vertically in the boundary region BNDR adjacent to the active region ACTR of the optical-black region OBR to block the leakage light and the diffusion carriers from the active region ACTR.

As compared with the embodiment of FIG. 7, the image sensor 10g of FIG. 10 may include the leakage-light prevention vertical structure using dummy pixels 106 formed in the boundary region BNDR. The positive drain voltage VDD may be applied to the photoelectric conversion unit 110 of the dummy pixels 106. For example, the positive drain voltage VDD may be a power supply voltage of the image sensor 10g. The photoelectric conversion unit 110 of the dummy pixels 106 may be electrically connected, through interlayer contacts such as vias (not shown), to the wire in the metal layer M1 or M2, to which the positive drain voltage is applied. As such, the leakage-light prevention vertical structure may be implemented using the dummy pixels 106 instead of the deep trench.

The second buried well 180 is formed horizontally in a bottom portion of the optical-black region OBR and the second buried well 180 is doped with n-type impurities to capture the diffusion electrons from the active region ACTR. The vertical contact 190 is formed vertically from an upper surface of the semiconductor substrate 100 to the second buried well 180 to apply the positive drain voltage to the second buried well 180. The vertical contact 190 is electrically connected to the metal wire in the metal layer M1 or M2, to which the positive drain voltage is applied, and thus the diffusion electrons captured by the buried well 180 may be drained through the vertical contact 190. The black levels provided by the second pixels 104 may be further stabilized by capturing and draining the diffusion electrons inflowing from the bottom direction of the optical-black region OBR.

As such, the image sensor 10g of FIG. 10 may provide the further stabilized black levels using the combination of the light-leakage prevention vertical structure such as the dummy pixels 106 and the light-leakage prevention horizontal structure such as the second buried well 180.

Figure 11:
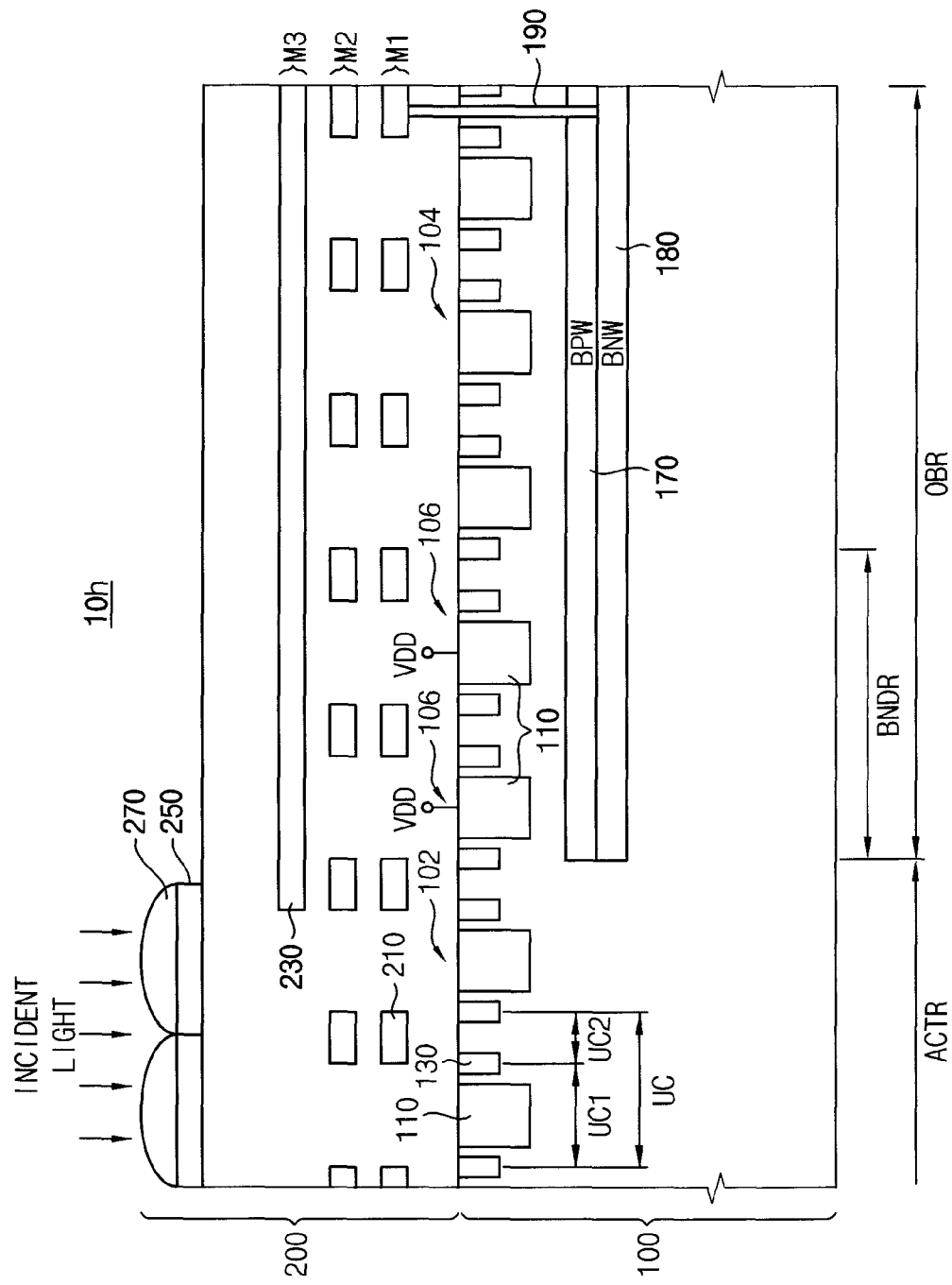

Referring to FIG. 11, an image sensor 10h may include first pixels 102, second pixels 104, a first buried well (BPW) 170 of a p-type, a second buried well (BNW) 180 of an n-type and a vertical contact 190.

The first pixels 102 are formed in the active region ACTR of the semiconductor substrate 100 to measure photo-charges corresponding to incident light. The second pixels 104 are formed in the optical-black region OBR of the semiconductor substrate 100 to provide the black levels. In other exemplary embodiments as described above, the deep trench 160 may be formed vertically in the boundary region BNDR adjacent to the active region ACTR of the optical-black region OBR to block the leakage light and the diffusion carriers from the active region ACTR.

As compared with the embodiment of FIG. 8, the image sensor 10h of FIG. 11 may include the leakage-light prevention vertical structure using dummy pixels 106 formed in the boundary region BNDR. The positive drain voltage VDD may be applied to the photoelectric conversion unit 130 of the dummy pixels 106.

The first buried well 170 is formed horizontally in a bottom portion of the optical-black region OBR and the first buried well 170 is doped with p-type impurities to repel the diffusion electrons from the active region ACTR. The second buried well 180 is formed horizontally in another bottom portion of the optical-black region OBR and the second buried well 180 is doped with n-type impurities to capture the diffusion carriers from the active region ACTR.

As illustrated in FIG. 11, the first buried well 170 may be disposed on the second buried well 180. The vertical contact 190 is formed vertically from an upper surface of the semiconductor substrate 100 to the second buried well 180 to apply a positive drain voltage to the second buried well 180. The vertical contact 190 is electrically connected to the metal wire in the metal layer M1 or M2, to which the positive drain voltage is applied, and thus the diffusion electrons captured by the second buried well 180 may be drained through the vertical contact 190. In addition, the first buried well 170 may repel the electrons escaping from the second buried well 180 and thus the electrons reaching the second pixels 104 may be further reduced. The black levels provided by the second pixels 104 may be further stabilized by capturing and repelling the diffusion electrons using the two buried wells 170 and 180 to reduce the number of electrons reaching the second pixels 104 from the bottom direction of the optical-black region OBR.

As such, the image sensor 10e of FIG. 8 may provide the further stabilized black levels using the combination of the light-leakage prevention vertical structure such as the dummy pixels 106 and the light-leakage prevention horizontal structure such as the first and second buried wells 170 and 180.

Figure 12:
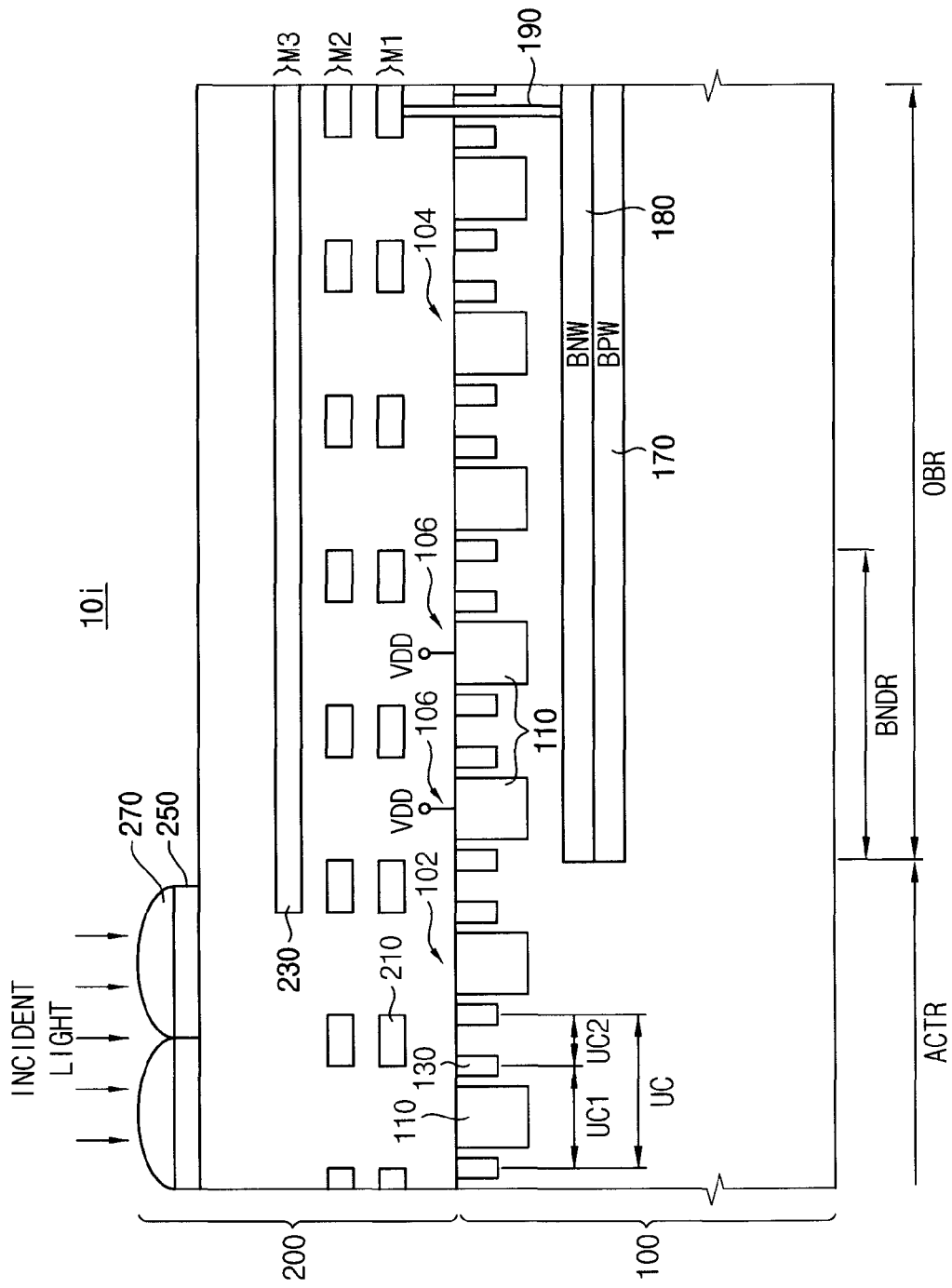

Referring to FIG. 12, an image sensor 10i may include first pixels 102, second pixels 104, a first buried well (BPW) 170 of a p-type, a second buried well (BNW) 180 of an n-type and a vertical contact 190.

The first pixels 102 are formed in the active region ACTR of the semiconductor substrate 100 to measure photo-charges corresponding to incident light. The second pixels 104 are formed in the optical-black region OBR of the semiconductor substrate 100 to provide the black levels. In other exemplary embodiments as described above, the deep trench 160 is formed vertically in the boundary region BNDR adjacent to the active region ACTR of the optical-black region OBR to block the leakage light and the diffusion carriers from the active region ACTR.

As compared with the embodiment of FIG. 9, the image sensor 10i of FIG. 12 may include the leakage-light prevention vertical structure using dummy pixels 106 formed in the boundary region BNDR. The positive drain voltage VDD may be applied to the photoelectric conversion unit 130 of the dummy pixels 106.

The p-type buried well 170 is formed horizontally in a bottom portion of the optical-black region OBR and the p-type buried well 170 is doped with p-type impurities to repel the diffusion electrons from the active region ACTR. The second buried well 180 is formed horizontally in another bottom portion of the optical-black region OBR and the second buried well 180 is doped with n-type impurities to capture the diffusion carriers from the active region ACTR.

As compared with the embodiment of FIG. 11, the second buried well 180 may be disposed on the p-type buried well 170. The vertical contact 190 is formed vertically from an upper surface of the semiconductor substrate 100 to the second buried well 180 to apply a positive drain voltage to the second buried well 180. Even though the p-type buried well 170 repel the diffusion electrons from the active region ACTR, the electrons having high energy may penetrate the p-type buried well 170. The second buried well 180 may capture the electrons penetrating the p-type buried well 170. The vertical contact 190 is electrically connected to the metal wire in the metal layer M1 or M2, to which the positive drain voltage is applied, and thus the diffusion electrons captured by the second buried well 180 may be drained through the vertical contact 190. The black levels provided by the second pixels 104 may be further stabilized by capturing and repelling the diffusion electrons using the two buried wells 170 and 180 to reduce the number of electrons reaching the second pixels 104 from the bottom direction of the optical-black region OBR.

As such, the image sensor 10i of FIG. 12 may provide the further stabilized black levels using the combination of the light-leakage prevention vertical structure such as the dummy pixels 106 and the light-leakage prevention horizontal structure such as the p-type and second buried wells 170 and 180.

FIGS. 13A, 13B, 13C and 13D are diagrams illustrating electric potentials according to a depth in the image sensor according to exemplary embodiments. In FIGS. 13A through 13D, the horizontal reference axis represents a depth from the upper surface 280 of the semiconductor substrate and the vertical reference axis represents an electric potential (EP).

Figure 13A:
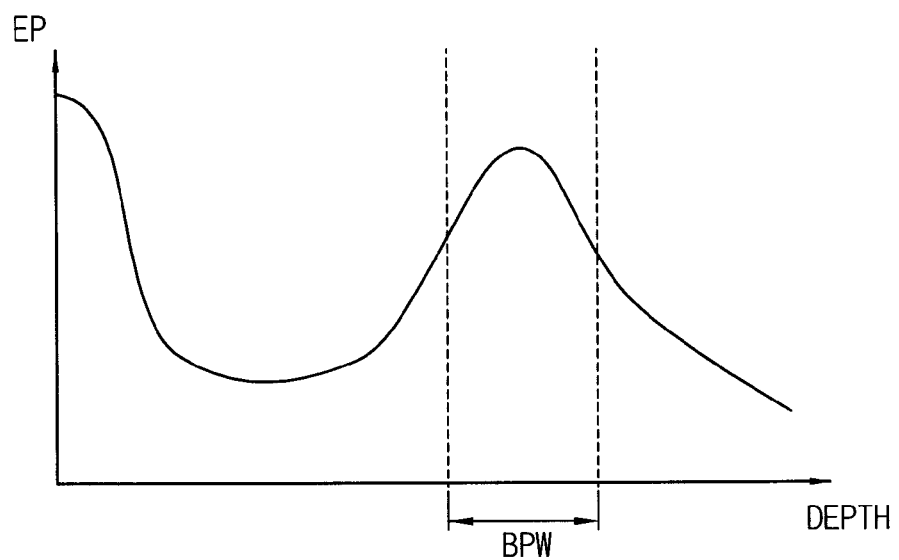
FIGS. 13A, 13B, 13C and 13D are diagrams illustrating electric potentials with respect to a depth in the image sensor according to an exemplary embodiment.
Figure 13B:
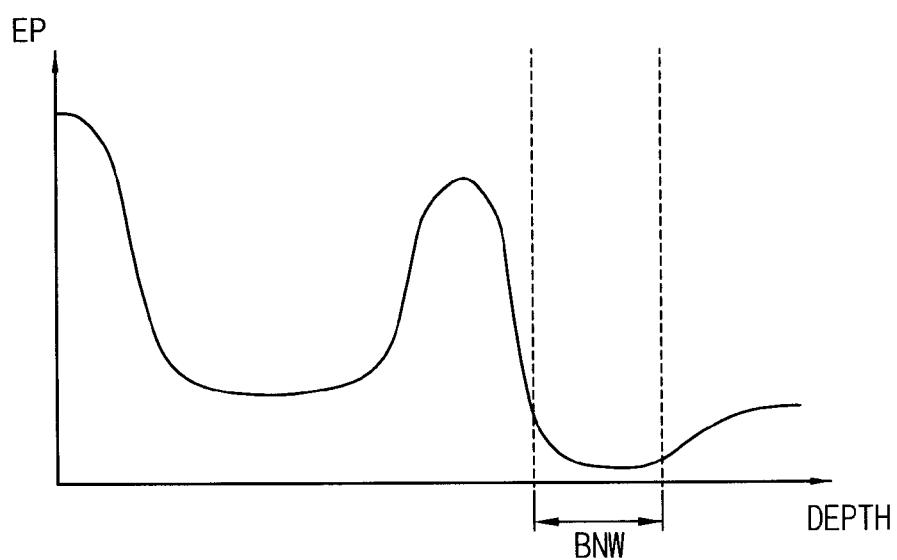
Figure 13C:
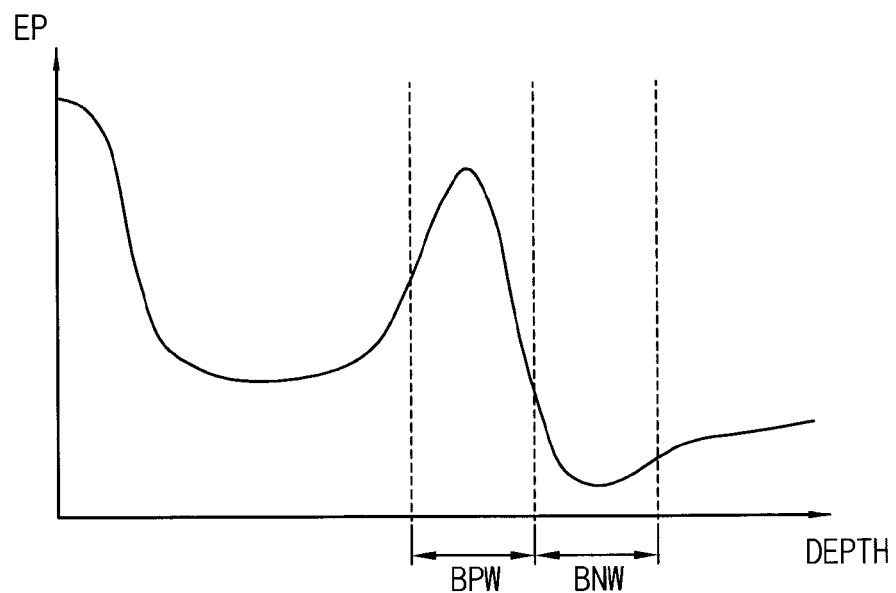
Figure 13D:
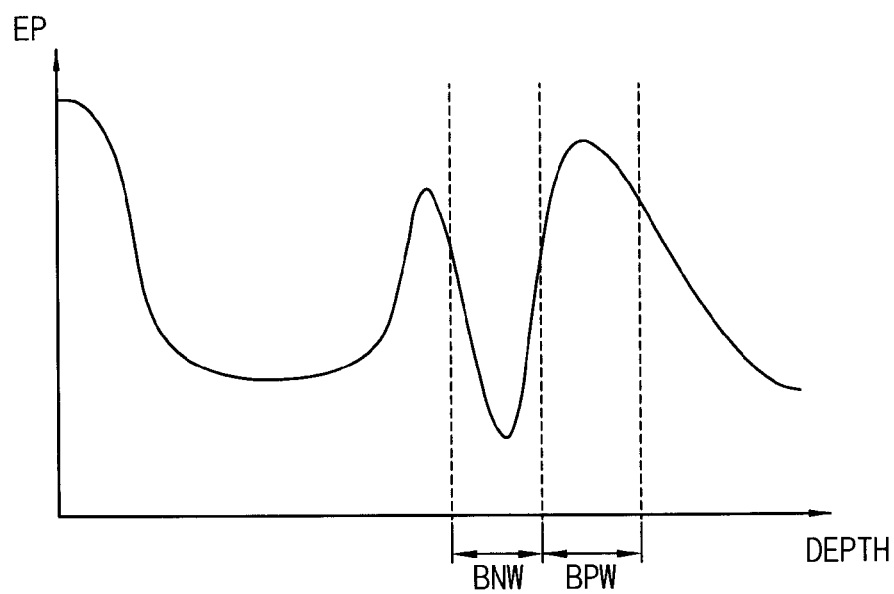

FIG. 13A illustrates the electric potential corresponding to the image sensor including one p-type buried well BPW as described with reference to FIG. 6, FIG. 13B illustrates the electric potential corresponding to the image sensor including one n-type buried well BNW as described with reference to FIGS. 7 and 10, FIG. 13C illustrates the electric potential corresponding to the image sensor including a second buried well BNW and a p-type buried well BPW on the n-type buried well BNW as described with reference to FIGS. 8 and 11, and FIG. 13D illustrates the electric potential corresponding to the image sensor including a p-type buried well BPW and an n-type buried well BNW on the p-type buried well BPW as described with reference to FIGS. 9 and 12.

Referring to FIG. 13A, a high potential wall may be formed by the p-type buried well BPW and thus the diffusion electrons may be repelled by the potential wall. Only the electrons having energy higher than the potential wall may penetrate the p-type buried well to reach the upper portion of the optical-black region in which the second pixels for providing the black levels are formed. Accordingly, as the height of the potential wall is increased, the number of the diffusion electrons penetrating the p-type buried well BPW and affecting the second pixels may be reduced.

Referring to FIG. 13B, a deep potential well may be formed by the n-type buried well BNW and thus the diffusion electrons may be captured in the potential well. The potential wall over the n-type buried well BNW becomes higher due to the potential well. Accordingly the diffusion electrons may be captured by the n-type buried well and the number of the diffusion electrons penetrating the n-type buried well BNW and affecting the second pixels may be reduced.

Referring to FIG. 13C, a deep potential well may be formed by the n-type buried well BNW and a high potential wall may be formed, over the potential well, by the p-type buried well BPW. First, the diffusion electrons from the active region may be captured by the n-type buried well BNW. Second, the electrons escaping from the n-type buried well BNW may be repelled by the p-type buried well BPW. Accordingly the number of the diffusion electrons penetrating the n-type buried well BNW and affecting the second pixels may be further reduced.

Referring to FIG. 13D, a high potential wall may be formed by the p-type buried well BPW and a deep potential well may be formed, over the potential wall, by the n-type buried well BNW. First, the diffusion electrons from the active region may be repelled by the p-type buried well BPW. Second, the electrons penetrating the p-type buried well BPW may be captured by the n-type buried well BNW. Accordingly the number of the diffusion electrons penetrating the n-type buried well BNW and affecting the second pixels may be further reduced.

FIGS. 14A, 14B, 14C, 14D and 14E are diagrams illustrating manufacturing processes of the image sensor according to exemplary embodiments.

The processes of forming the buried wells 170 and 180 and the deep trench 160 are described with reference to FIGS. 14A through 14E, and the processes of forming the other structures may be omitted.

Figure 14A:
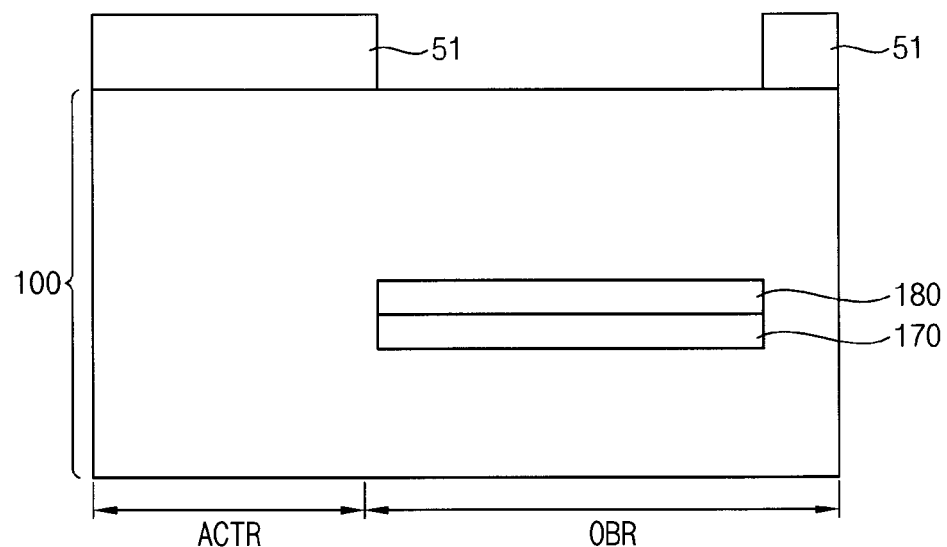
FIGS. 14A, 14B, 14C, 14D and 14E are diagrams illustrating manufacturing processes of the image sensor according to an exemplary embodiment.

Referring to FIG. 14A, the buried wells 170 and 180 may be formed using the mask film 51 that is patterned on the upper surface of the semiconductor substrate 100. The mask film 51 is formed on the entire surface of the semiconductor substrate 100 and then the portion of the mask corresponding to the location of the buried wells 170 and 180 are removed through the mask opening processes. Then the buried wells 170 and 180 are formed in the bottom portion of the optical-black region OBR through the ion-implanting processes. For example, the p-type buried well 170 may be formed by implanting the p-type dopants such as boron, gallium, indium, etc., and then the n-type buried well 180 may be formed on the p-type buried well 170 by implanting the n-type dopants such as arsenic, antimony, phosphorous, etc. as illustrated in FIG. 14A. In other exemplary embodiments, the second buried well 180 may be formed and then the p-type buried well 170 may be formed on the second buried well 180. After forming the buried well 170 and 180, the patterned mask film 51 is removed.

Figure 14B:
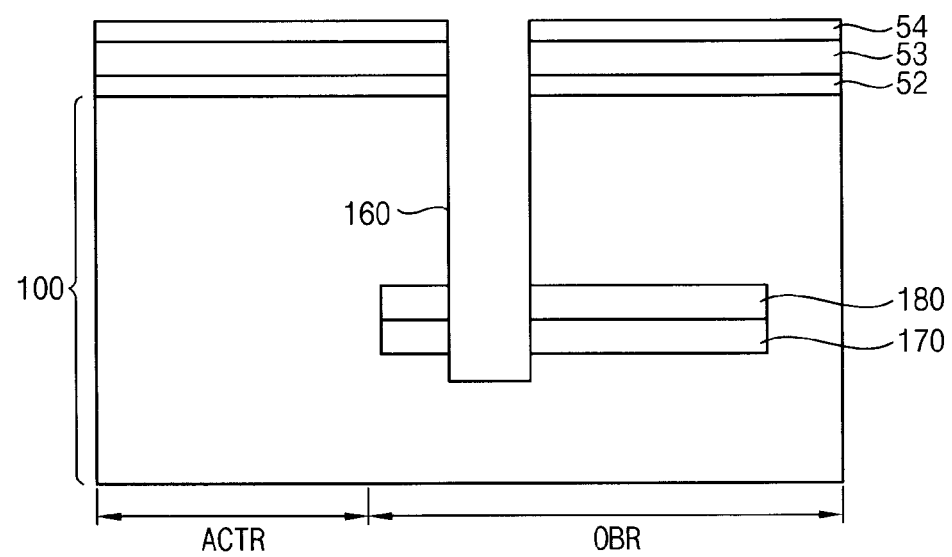

Referring to FIG. 14B, after forming the pad oxide film 52 and pad nitride film 53, the deep trench 160 is formed through the deep trench isolation (DTI) processes. For example, a portion of the pad nitride film 53 and the pad oxide film 52 may be etched using the patterned hard mask film 54 as an etching barrier, and then the open portion of the semiconductor substrate 100 may be etched to form the deep trench 160. The deep trench 160 may be formed to the depth of contacting or penetrating the buried wells 170 and 180.

For example, the deep trench 160 may be formed through the bosh process. That is, the deep trench 160 may be formed by repeatedly performing inductive coupled plasma deep reactive ion etching (ICP DRIE) using SF6 or O2 plasma and the sidewall passivation process using CFx. After forming the deep trench 160, the hard mask film 54 is removed.

Figure 14C:
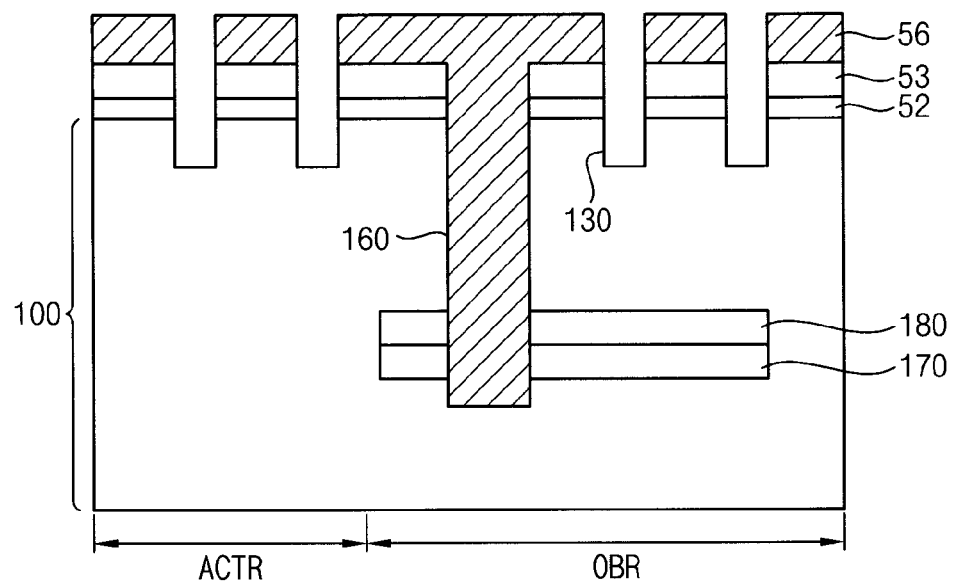

Referring to FIG. 14C, after forming the photoresist patterns 56 for shallow trench isolation, etching may be performed to form the shallow trenches 130 and then the photoresist patterns 56 are removed.

Figure 14D:
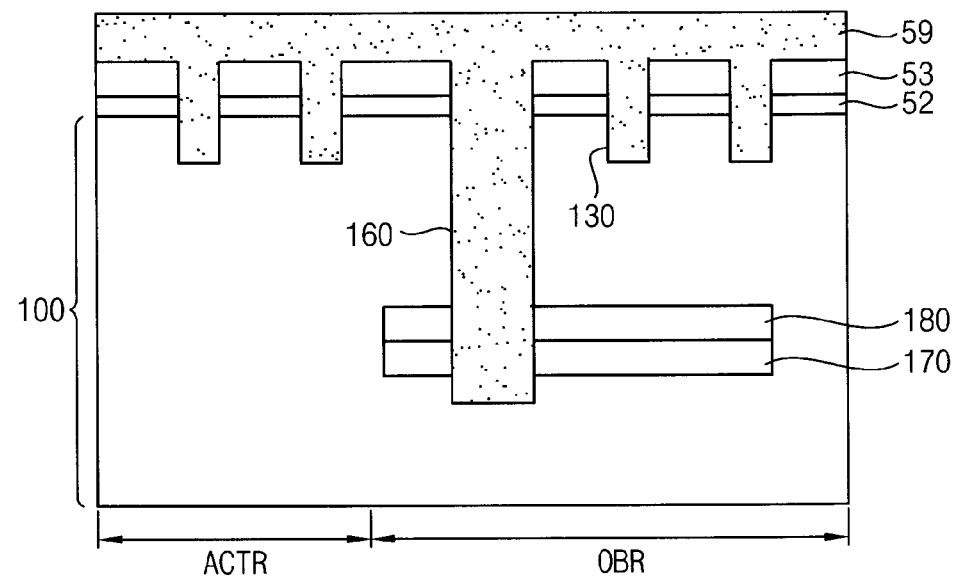

Referring to FIG. 14D, the oxide film 59 may be deposited to fill the deep trench 160 and the shallow trenches 130. As described with reference to FIG. 5, the metal coating layer may be formed on the inner surface of the deep trench 160 before depositing the oxide film 59.

Figure 14E:
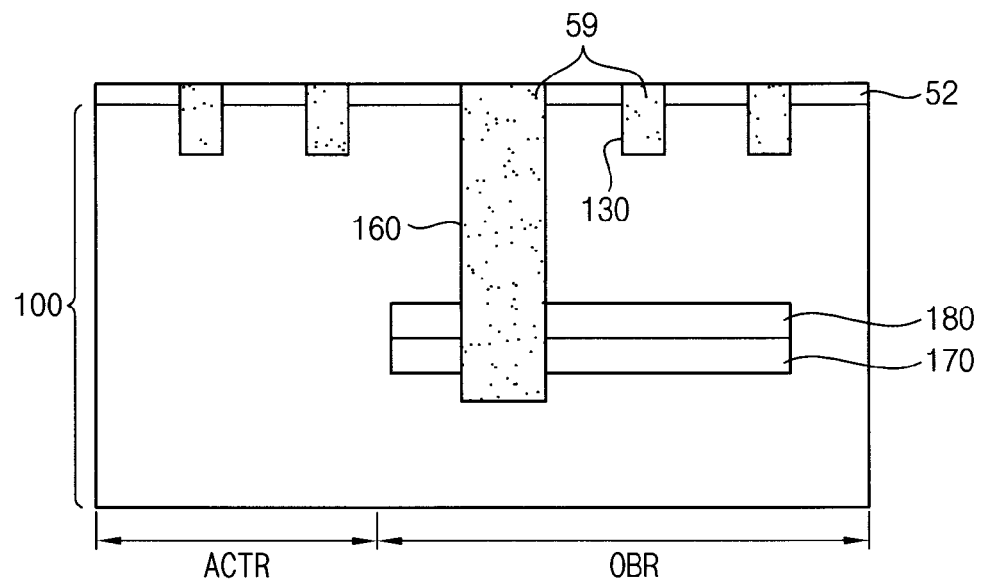

Referring to FIG. 14E, the pad nitride film 53 is removed and the planarization process of the oxide film 52 is performed. As such the deep trench 160 to block the leakage light and the diffusion carriers and the shallow trenches 130 to isolate the respective pixels and components may be formed. Then, the processes for forming gates of transistors, inter-layer contacts, metal wires, etc. may be performed.

As such, at least a portion of processes of forming the deep trench 160 and the shallow trench 130 may be shared and thus the deep trench 160 may be formed efficiently by modifying the STI processes without causing excessive additional processes.

Figure 15A:
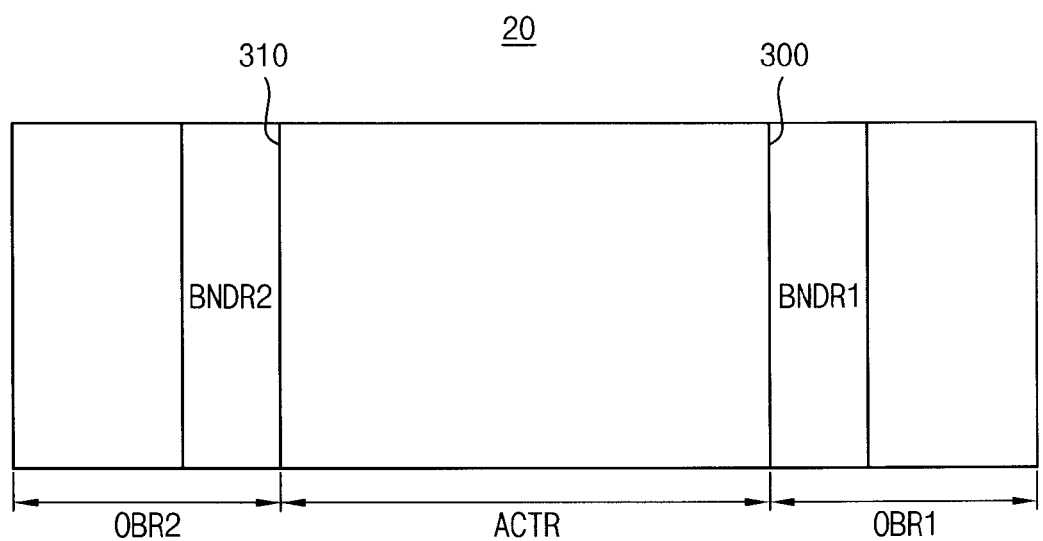
FIGS. 15A, 15B and 15C are diagrams illustrating layouts of an image sensor according to an exemplary embodiment.
Figure 15B:
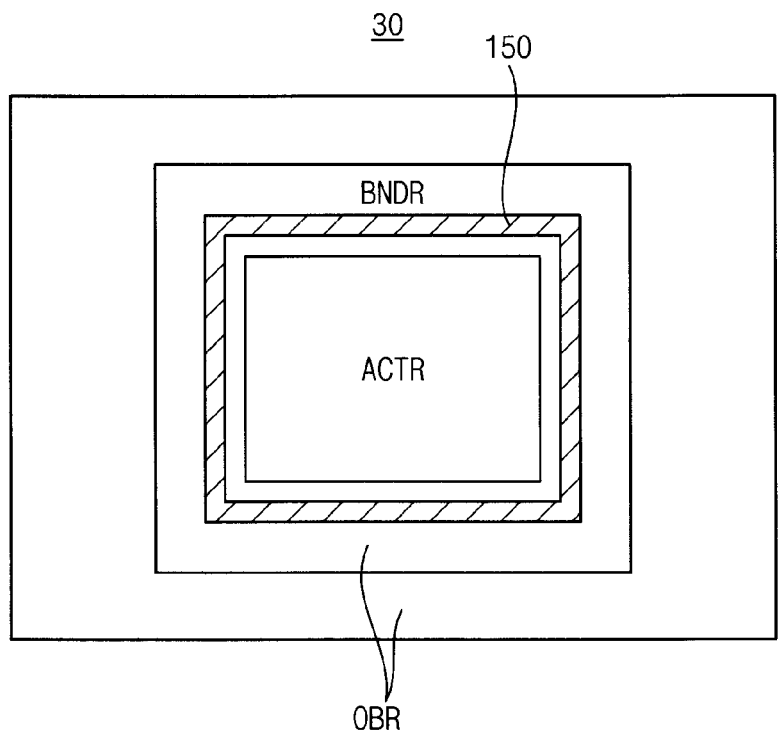
Figure 15C:
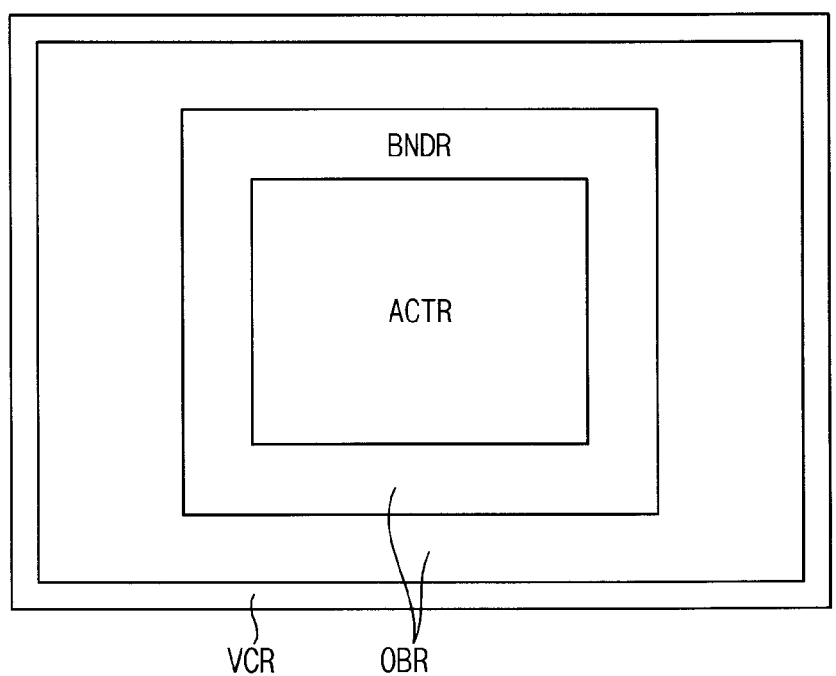

FIGS. 15A, 15B and 15C are diagrams illustrating layouts of an image sensor according to exemplary embodiments.

Referring to FIG. 15A, an image sensor 20 may include an active region ACTR, a first optical-black region OBR1 and a second optical-black region OBR2. The first optical-black region includes a first boundary region BNDR1 adjacent to one side 300 of the active region ACTR and the second optical-black region includes a second boundary region BNDR2 adjacent to the other side 310 of the active region ACTR. As described above, the image sensor 20 may be formed using the semiconductor substrate.

First pixels, that is, active pixels are formed in the active region ACTR of the semiconductor substrate to measure photo-charges corresponding to incident light. Second pixels, that is, auto dark level compensation (ADLC) pixels are formed in the first and second optical-black regions OBR1 and OBR2 of the semiconductor substrate.

As the light-leakage prevention vertical structure, a first deep trench may be formed vertically in the first boundary region BNDR1 of the first optical-black region OBR1 and a second deep trench may be formed vertically in the second boundary region BNDR2 of the second optical-black region OBR2. As described above, at least one buried well may be formed in the bottom portion of the first and second optical-black regions OBR1 and OBR2.

As such, by forming the light-leakage prevention vertical structure such as the deep trenches and the light-leakage prevention horizontal structure such as the buried well, the number of diffusion carriers reaching the second pixels for providing the black levels may be reduced.

Referring to FIG. 15B, an image sensor 30 includes an active region ACRT and an optical-black region OBR. The optical-black region OBR includes a boundary region adjacent to the active region ACTR. As illustrated in FIG. 15B, the optical-black region OBR may surround the active region, and the deep trench 150 that is formed in the boundary region BNDR may have a ring-shape to surround the active region.

Referring to FIG. 15C, an image sensor 40 may further include a vertical contact region VCR compared with the image sensor 30 of FIG. 15B. The vertical contact region VCR may surround the optical-black region OBR, that is, the vertical contact 190 described above may be formed in the vertical contact region VCR with a ring-shape to surround the optical-black region OBR. The positive drain voltage may be applied to the ring-shaped vertical contact to provide a path for draining the electrons captured by the n-type buried well. In addition, the ring-shaped vertical contact may prevent noise charges caused by peripheral circuits from being transferred to the second pixels in the optical black region OBR.

Figure 16:
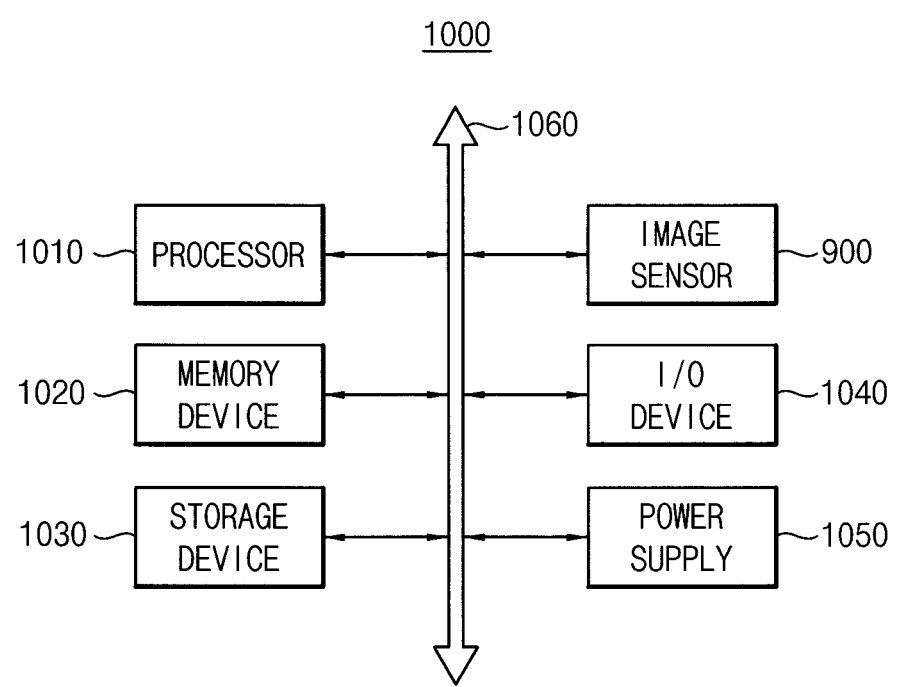
FIG. 16 illustrates a block diagram of an exemplary embodiment of a computing system including an image sensor.

FIG. 16 illustrates a block diagram of an exemplary embodiment of a computing system including an image sensor.

Referring to FIG. 16, a computing system 1000 may include a processor 1010, a memory device 1020, a storage device 1030, an input/output (I/O) device 1040, a power supply 1050 and an image sensor 900. Although it is not illustrated in FIG. 16, the computing system 1000 may further include ports that communicate with a video card, a sound card, a memory card, a USB device, or other electronic devices.

The processor 1010 may perform various calculations or tasks. According to embodiments, the processor 1010 may be a microprocessor or a CPU. The processor 1010 may communicate with the memory device 1020, the storage device 1030 and the input/output device 1040 via a bus 1060 such as an address bus, a control bus, and/or a data bus. In some embodiments, the processor 1010 may be coupled to an extended bus, such as a peripheral component interconnection (PCI) bus. The memory device 1020 may store data for operating the computing system 1000. For example, the memory device 1020 may be implemented with a dynamic random access memory (DRAM) device, a mobile DRAM device, a static random access memory (SRAM) device, a phase random access memory (PRAM) device, a ferroelectric random access memory (FRAM) device, a resistive random access memory (RRAM) device, and/or a magnetic random access memory (MRAM) device. The storage device may include a solid state drive (SSD), a hard disk drive (HDD), a CD-ROM, etc. The input/output device 1040 may include an input device (e.g., a keyboard, a keypad, a mouse, etc.) and an output device (e.g., a printer, a display device, etc.). The power supply 1050 supplies operation voltages for the computing system 1000.

The sensor 900 may communicate with the processor 1010 via the buses or other communication links. As described above, the sensor 900 includes the light-leakage prevention vertical structure such as the deep trench and/or the light-leakage prevention horizontal structure such as the buried well. The image sensor 900 may be integrated with the processor 1010 in one chip, or the image sensor 900 and the processor 1010 may be implemented as separate chips.

The image sensor 900 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

The computing system 1000 may be any computing system including an image sensor. For example, the computing system 1000 may include a digital camera, a mobile phone, a smart phone, a portable multimedia player (PMP), a personal digital assistant (PDA), etc.

Figure 17:
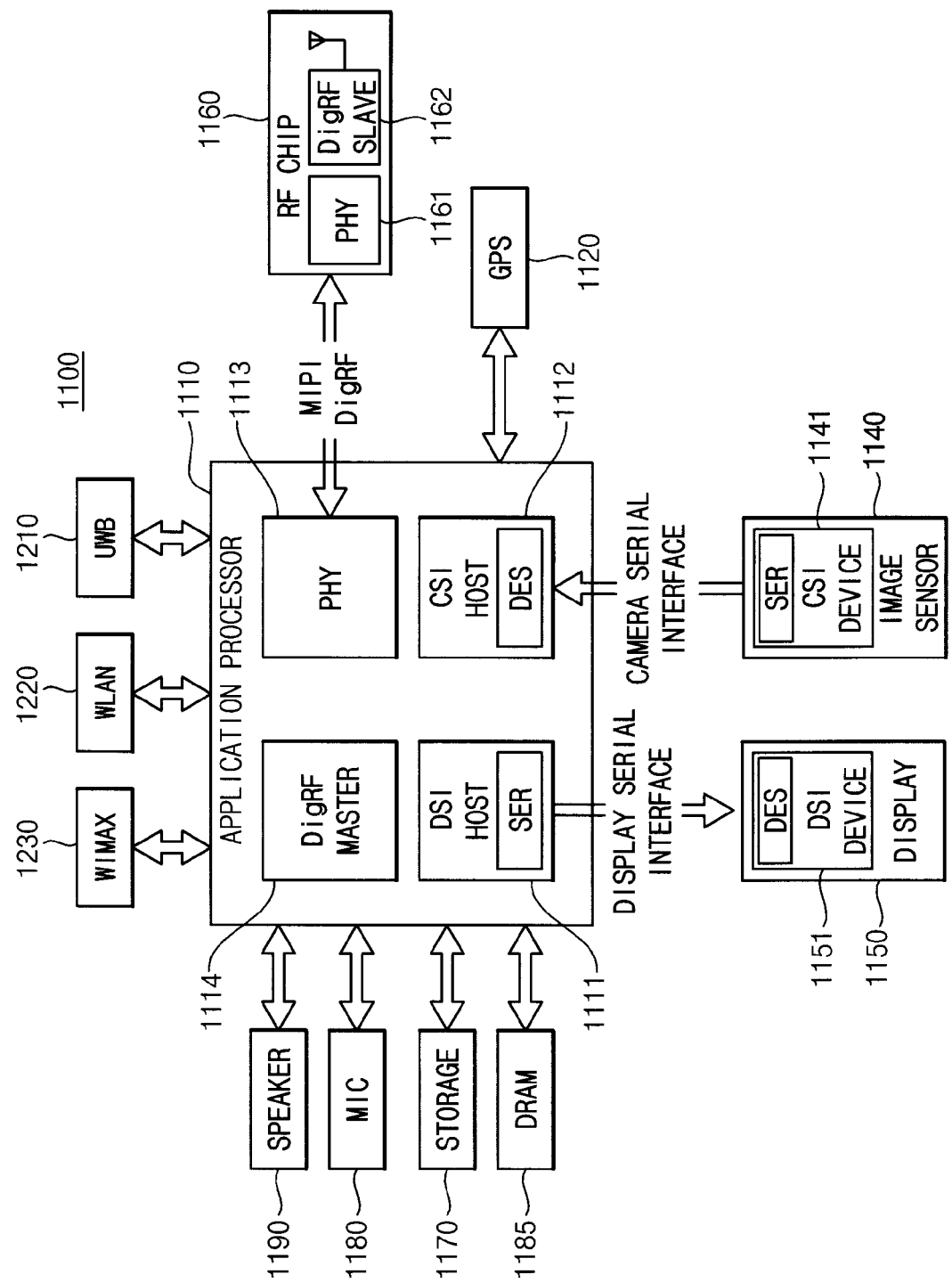
FIG. 17 illustrates a block diagram of an exemplary embodiment of a computing system.

FIG. 17 illustrates a block diagram of an exemplary embodiment of a computing system.

Referring to FIG. 17, a computing system 1100 may be implemented by a data processing device that uses or supports a mobile industry processor interface (MIPI) interface. The computing system 1100 may include an application processor 1110, an image sensor 1140, a display device 1150, etc. A CSI host 1112 of the application processor 1110 may perform a serial communication with a CSI device 1141 of the image sensor 1140 via a camera serial interface (CSI). In some embodiments, the CSI host 1112 may include a deserializer (DES), and the CSI device 1141 may include a serializer (SER). A DSI host 1111 of the application processor 1110 may perform a serial communication with a DSI device 1151 of the display device 1150 via a display serial interface (DSI).

In some exemplary embodiments, the DSI host 1111 may include a serializer (SER), and the DSI device 1151 may include a deserializer (DES). The computing system 1100 may further include a radio frequency (RF) chip 1160 performing a communication with the application processor 1110. A physical layer (PHY) 1113 of the computing system 1100 and a physical layer (PHY) 1161 of the RF chip 1160 may perform data communications based on a MIPI DigRF. The application processor 1110 may further include a DigRF MASTER 1114 that controls the data communications of the PHY 1161.

The computing system 1100 may further include a global positioning system (GPS) 1120, a storage 1170, a MIC 1180, a DRAM device 1185, and a speaker 1190. In addition, the computing system 1100 may perform communications using an ultra wideband (UWB) 1120, a wireless local area network (WLAN) 1220, a worldwide interoperability for microwave access (WIMAX) 1130, etc. However, the structure and the interface of the electric device 1000 are not limited thereto.

Exemplary features and/or exemplary embodiments described herein may be applied to any photo-detection device, such as a three-dimensional image sensor providing image information and depth information about an object. For example, one or more exemplary embodiments may be applied to a computing system, such as a face recognition security system, a desktop computer, a laptop computer, a digital camera, a three-dimensional camera, a video camcorder, a cellular phone, a smart phone, a personal digital assistant (PDA), a scanner, a video phone, a digital television, a navigation system, an observation system, an auto-focus system, a tracking system, a motion capture system, an image-stabilizing system, etc.

The foregoing exemplary embodiments and advantages are merely illustrative and not to be construed as limiting. Although a few exemplary embodiments have been described, those skilled in the art will readily appreciate that many modifications are possible in the exemplary embodiments without materially departing from the novel teachings and advantages of the present inventive concept. The present teaching can be readily applied to other types of apparatuses. Accordingly, all such modifications are intended to be included within the scope of the present inventive concept as defined in the claims. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims. Also, the description of exemplary embodiments is intended to be illustrative, and not to limit the scope of the claims, and many alternatives, modifications, and variations will be apparent to those skilled in the art.

What is claimed is:

1. An image sensor comprising:
first pixels which are formed in an active region of a semiconductor substrate and configured to measure photo-charges corresponding to incident light;

second pixels which are formed in an optical-black region of the semiconductor substrate and configured to measure black levels;
a deep trench which is formed substantially vertically, with respect to an upper surface of the semiconductor substrate, in a boundary region of the optical-black region;
an n-type buried well which is formed substantially horizontally, with respect to the upper surface of the semiconductor substrate, in a bottom portion of the optical-black region, and is doped with n-type impurities to capture photoelectrons diffused from the active region; and
a vertical contact which is formed substantially vertically from the upper surface of the semiconductor substrate to the n-type buried well, and is configured to apply a positive drain voltage to the n-type buried well,
wherein the vertical contact is disposed at an end portion of the optical-black region, the end portion being disposed opposite to the boundary region,
the boundary region is adjacent to the active region, and
the deep trench is configured to block leakage light and diffusion carriers from the active region.

2. The image sensor of claim 1, further comprising:
photoelectric conversion units of the first and second pixels which are formed vertically, with respect to the upper surface of the semiconductor substrate,
wherein a depth of the deep trench is greater than depths of the photoelectric conversion units of the first and second pixels.

3. The image sensor of claim 2, wherein the deep trench is filled with dielectric material having a refractive index higher than a refractive index of the semiconductor substrate.

4. The image sensor of claim of claim 2, wherein a metal coating layer is formed on an inner surface of the deep trench.

5. The image sensor of claim 2, wherein the optical-black region includes a first optical-black region and a second optical-black region disposed at a first side and a second side of the active region, respectively, and each comprising a boundary region adjacent the respective sides of the active region,
the deep trench includes a first deep trench and a second deep trench,
the first deep trench is formed substantially vertically in the boundary region of
the first optical-black region, with respect to the upper surface of the semiconductor substrate, and
the second deep trench is formed substantially vertically in the boundary region of the second optical-black region, with respect to the upper surface of the semiconductor substrate.

6. The image sensor of claim 2, wherein the optical-black region surrounds the active region, and the deep trench has a ring-shape to surround the active region.

7. The image sensor of claim 1, further comprising:
a p-type buried well which is formed substantially horizontally, with respect to the upper surface of the semiconductor substrate, in another bottom portion of the optical-black region, and is doped with p-type impurities to repel the photoelectrons diffused from the active region.

8. The image sensor of claim 7, wherein the p-type buried well is disposed on the n-type buried well, as seen in a direction from the bottom portion to the upper surface of the semiconductor substrate.

9. The image sensor of claim 7, wherein the n-type buried well is disposed on the p-type buried well, as seen in a direction from the bottom portion to the upper surface of the semiconductor substrate.

10. The image sensor of claim 1, wherein the boundary region is disposed in a region of the optical-black region which is free of the second pixels.

11. An image sensor comprising:
first pixels which are formed in an active region of a semiconductor substrate, and are configured to measure photo-charges corresponding to incident light;
second pixels which are formed in an optical-black region of the semiconductor substrate, and are configured to measure black levels;
an n-type buried well which is formed substantially horizontally, with respect to an upper surface of the semiconductor substrate, in a bottom portion of the optical-black region, and is doped with n-type impurities to capture photoelectrons diffused from the active region; and
a vertical contact which is formed substantially vertically from an upper surface of the semiconductor substrate to the n-type buried well, and is configured to apply a positive drain voltage to the n-type buried well,
wherein the vertical contact is disposed at an end portion of the optical-black region, the end portion being disposed at a side of the optical-black region which is opposite to a boundary region adjacent to the active region.

12. The image sensor of claim 11, wherein the optical-black region surrounds the active region, and
the vertical contact has a ring-shape to surround the optical-black region.

13. The image sensor of claim 11, further comprising:
a p-type buried well which is formed substantially horizontally, with respect to the upper surface of the semiconductor substrate, in another bottom portion of the optical-black region, and is doped with p-type impurities to repel the photoelectrons diffused from the active region.

* * * * *